United States Patent
Kudo et al.

(10) Patent No.: US 9,553,242 B2
(45) Date of Patent: Jan. 24, 2017

(54) SEMICONDUCTOR DEVICE PACKAGE ASSEMBLY, SEMICONDUCTOR DEVICE ASSEMBLY, AND METHOD OF MANUFACTURING SEMICONDUCTOR DEVICE

(75) Inventors: Takaaki Kudo, Tokyo (JP); Naofumi Ikenaga, Tokyo (JP); Tetsu Urano, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 555 days.

(21) Appl. No.: 13/614,027

(22) Filed: Sep. 13, 2012

(65) Prior Publication Data

US 2013/0100621 A1  Apr. 25, 2013

(30) Foreign Application Priority Data

Oct. 25, 2011 (JP) .................. 2011-234085

(51) Int. Cl.
| | |
|---|---|
| *H05K 1/03* | (2006.01) |
| *H01L 33/48* | (2010.01) |
| *H01L 23/00* | (2006.01) |
| *H01L 33/62* | (2010.01) |

(52) U.S. Cl.
CPC ............ *H01L 33/486* (2013.01); *H01L 24/97* (2013.01); *H01L 33/62* (2013.01); *H01L 2224/48091* (2013.01); *H01L 2224/48247* (2013.01); *H01L 2924/12041* (2013.01); *H01L 2924/181* (2013.01); *H01L 2933/0033* (2013.01)

(58) Field of Classification Search
CPC ........ H01L 33/486; H01L 33/62; H01L 24/97; H01L 2924/181; H01L 2933/0033
USPC ................ 174/255, 250, 257, 258, 260, 261
See application file for complete search history.

(56) References Cited

FOREIGN PATENT DOCUMENTS

JP  2011-138849 A  7/2011

OTHER PUBLICATIONS

Machine Translation of Japanese Patent Publication No. 2011-138849A (Jul. 14, 2011).*

* cited by examiner

*Primary Examiner* — Tremesha S Willis
(74) *Attorney, Agent, or Firm* — Holtz, Holtz & Volek PC

(57) ABSTRACT

A semiconductor device package assembly which increases production efficiency of semiconductor devices by enabling the number of semiconductor device packages held by a carrier to be increased. A predetermined area of a first housing molded of white-colored resin, which holds a plurality of bent contacts, is covered by a second housing molded of black-colored resin, and a plurality of second housings are supported by a secondary molding carrier in high density. A linking portion of each contact and one or both of the first and second housings are integrated by insert molding.

36 Claims, 32 Drawing Sheets

SEMICONDUCTOR DEVICE PACKAGE ASSEMBLY, SEMICONDUCTOR DEVICE ASSEMBLY, AND METHOD OF MANUFACTURING SEMICONDUCTOR DEVICE

BACKGROUND OF THE INVENTION

Field of the Invention

This invention relates to a semiconductor device package assembly, a semiconductor device assembly, and a method of manufacturing a semiconductor device.

Description of the Related Art

Conventionally, there has been known a method of manufacturing a light emitting device, in which a plurality of packages are collectively manufactured (see Japanese Laid-Open Patent Publication (Kokai) No. 2011-138849, Paragraphs 0067, and 0072 to 0078, FIGS. 1, and 7 to 10). This manufacturing method will be described with reference to FIGS. 28 to 32. Note that FIGS. 28 to 32 correspond to FIGS. 1, and 7 to 10 in Japanese Laid-Open Patent Publication (Kokai) No. 2011-138849, respectively. However, reference numerals in the drawings of the publication are changed, and part of reference numerals are deleted.

First, as shown in FIGS. 32A and 32B, white-colored second resin material is filled into a cavity formed between an upper mold 931a and a lower mold 931b to thereby integrally mold a second molded resin 906 and a conductor portion 904 (primary molding). As a result, the plurality of second molded resins 906 are arranged at equally-spaced intervals on one substrate 911 (see FIG. 29). The second molded resins 906 are each held by one set of conductor portions 904a to 904h of the substrate 911 (see FIGS. 30A and 31A). Note that the substrate 911 has a plate-like shape, formed by blanking one metal thin plate, and is formed by a plurality of sets of conductor portions 904a to 904f serving as leads of a light emitting device 901, and a carrier 915 which supports the plurality of sets of conductor portions 904a to 904f. Further, the conductor portions 904a to 904f each horizontally extend.

Next, as shown in FIGS. 32C and 32D, black-colored first resin material is filled into a cavity formed between an upper mold 941a and a lower mold 941b to thereby integrally form a first molded resin 905, the second molded resin 906, and the conductor portions 904 (904a to 904h) into one molded piece (secondary molding). As a result, a package 902 is formed.

Then, light emitting devices 903 are arranged on a bottom surface 902c of a recess 902a of the package 902, and portions of the conductor portions 904a to 904f which are exposed on the bottom surface 902c of the recess 902a and electrode terminals of the light emitting devices 903 are electrically connected by wires 907, respectively.

Next, seal material is injected into the recess 902a of the package 902, and is cured to thereby form a sealing member (not shown).

Thereafter, the packages 902 are cut out of the substrate 911 on which the packages 902 are arranged.

Finally, the conductor portions 904a to 904f which are horizontally exposed from side surfaces 902e of each package 902 are bent from the side surfaces 902e along an underside surface (bottom surface) 902f of the package 902 to thereby form terminal portions for external connection.

The light emitting device 901 manufactured according to the above-described manufacturing method is used as a component e.g. of a display device (not shown). In this case, a plurality of light emitting devices 901 are arranged on a substrate, not shown, in a matrix, and are soldered to the substrate. Further, black-colored resin is poured around the light emitting devices 901 arranged on the substrate to form a black resin layer (not shown), and the resin layer covers the conductor portions 904a to 904f exposed on the side surfaces 902e of each light emitting device 901, whereby high contrast is ensured.

In a case where the above-described light emitting device 901 does not have a sufficiently large height (length from an upper surface 902d of the package 902 to the terminal portions of the conductor portions 904a to 904f for external connection), when black-colored resin is poured around the light emitting devices 901 in the manufacturing of a display device, the resin may adhere to a surface of the sealing member of the light emitting devices 901.

To avoid this problem, it is only necessary to increase the height of the light emitting device 901 by increasing the length of the conductor portions 904a to 904f. However, if the height of the light emitting device 901 is increased, this increases the arrangement pitch of the packages 902 on the substrate 911, whereby the packages 902 held by the substrate 911 are reduced in density, which reduces production efficiency of the light emitting device 901.

SUMMARY OF THE INVENTION

The present invention has been made in view of these circumstances, and an object thereof is to increase production efficiency of a semiconductor device by making it possible to increase the number of semiconductor device packages held by a carrier.

To attain the above object, in a first aspect of the present invention, there is provided semiconductor device package assembly comprising a plurality of semiconductor device packages each including a plurality of contacts each bent into a predetermined shape, a first housing which is molded of light-colored resin and holds the plurality of contacts, and a second housing which is molded of dark-colored resin and covers a predetermined area of the first housing, and a carrier which supports the plurality of semiconductor device packages in high density, wherein the contacts each include a first connection portion to which a semiconductor element is connected, a second connection portion which is connected to a substrate, and a linking portion which link the first connection portion and the second connection portion, wherein the first connection portion is exposed in an accommodation cavity formed in an upper portion of the first housing, for accommodating semiconductor elements, wherein the second connection portion is exposed outward from respective lower portions of the first housing and the second housing, and wherein the linking portion and at least the first housing are integrated by insert molding.

Preferably, the contact has a smaller thickness dimension than a thickness dimension of the carrier.

Preferably, the linking portion extends in a direction of height of the first housing, and the first connection portion and the second connection portion extend in a direction orthogonal to the direction of the height of the first housing.

Preferably, the predetermined area is an outer peripheral surface of the first housing and an inner wall surface of the first housing.

More preferably, the linking portion is sandwiched between the first housing and the second housing.

To attain the above object, in a second aspect of the present invention, there is provided a semiconductor device assembly wherein each semiconductor element connected to the first connection portion in the semiconductor device package assembly in the accommodation cavity by transparent resin filled in the accommodation cavity.

Preferably, the semiconductor element is a light emitting diode.

To attain the above object, in a third aspect of the present invention, there is provided a method of manufacturing a semiconductor device including a plurality of contacts each bent into a predetermined shape, a first housing which is molded of light-colored resin and holds the plurality of contacts, and a second housing which is molded of dark-colored resin and covers a predetermined area of the first housing, wherein the contacts each include a first connection portion to which a semiconductor element is connected, a second connection portion which is connected to a substrate, and a linking portion which link the first connection portion and the second connection portion, wherein the first connection portion is exposed in an accommodation cavity formed in an upper portion of the first housing, for accommodating semiconductor elements, wherein the second connection portion is exposed outward from respective lower portions of the first housing and the second housing, and wherein the linking portion and at least the first housing are integrated by insert molding, the method comprising a primary molding step of molding the linking portion of each contact of the light-colored resin by insert molding and causing the first housing to hold the linking portion, a primary molding carrier-removing step of removing a primary molding carrier which supports the plurality of contacts after the primary molding step, a secondary molding step of accommodating the first housings in a plurality of housing accommodation holes formed in a secondary molding carrier, respectively, after the primary molding carrier-removing step, and insert-molding the first housings and protrusions of the secondary molding carrier each of which protrudes toward the first housing in each housing accommodation hole with the dark-colored resin to thereby mold the second housings each of which covers the predetermined area of the first housing and links the first housing and the protrusions, a semiconductor element-mounting step of accommodating the semiconductor elements in an accommodation cavity of each first housing and connecting the semiconductor elements to the first connection portions, respectively, after the secondary molding step, and filling transparent resin in the accommodation cavity, and a secondary molding carrier-removing step of removing the secondary molding carrier from the second housings after the semiconductor element-mounting step.

According to this invention, it is possible to increase production efficiency of a semiconductor device by making it possible to increase the number of semiconductor device packages held by a carrier.

The above and other objects, features and advantages of the present invention will become more apparent from the following detailed description taken in conjunction with the accompanying drawings.

BRIEF DESCRIPTION OF THE DRAWINGS

FIGS. 30A and 30B are perspective views showing shapes of a bottom side of the package during the process for manufacturing the conventional light emitting device, in which FIG. 30A shows a shape at the time of completion of primary molding, and FIG. 30B shows a shape at the time of completion of secondary molding;

FIGS. 31A and 31B are a perspective views showing shapes of an upper portion side of the package during the process of manufacturing the conventional light emitting device, in which FIG. 31A shows a shape at the time of completion of the primary molding, and FIG. 31B shows a shape at the time of completion of the secondary molding; and FIGS. 32A to 32D are cross-sectional views schematically showing the process of manufacturing the conventional light emitting device, in which FIG. 32A shows an example of molds for the primary molding, FIG. 32B shows the primary molding process, FIG. 32C shows an example of molds for the secondary molding, and FIG. 32D shows the secondary molding process.

DETAILED DESCRIPTION OF THE PREFERRED EMBODIMENTS

Figure 1:
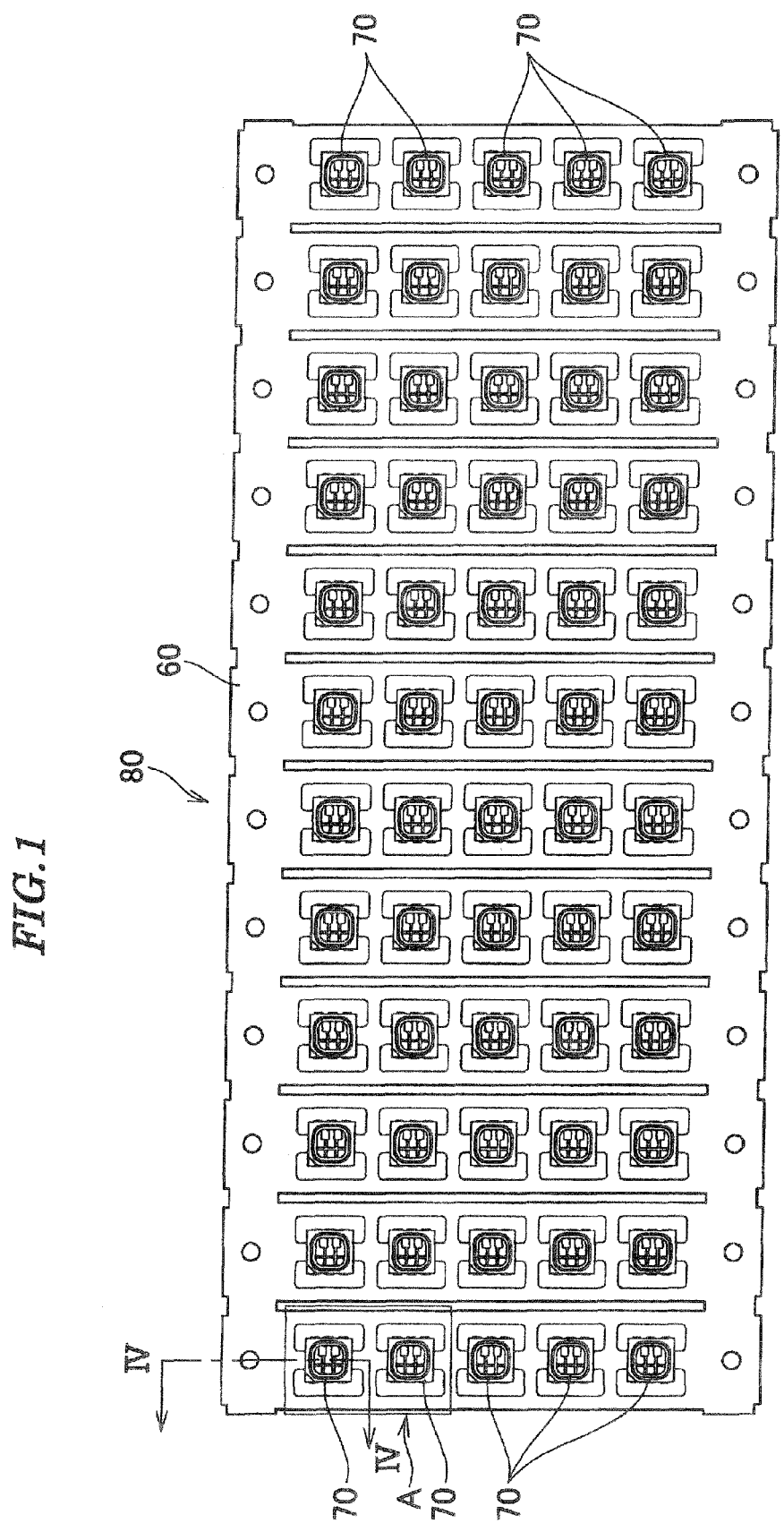
FIG. 1 is a plan view of a semiconductor device package assembly according to an embodiment of the present invention.
Figure 2:
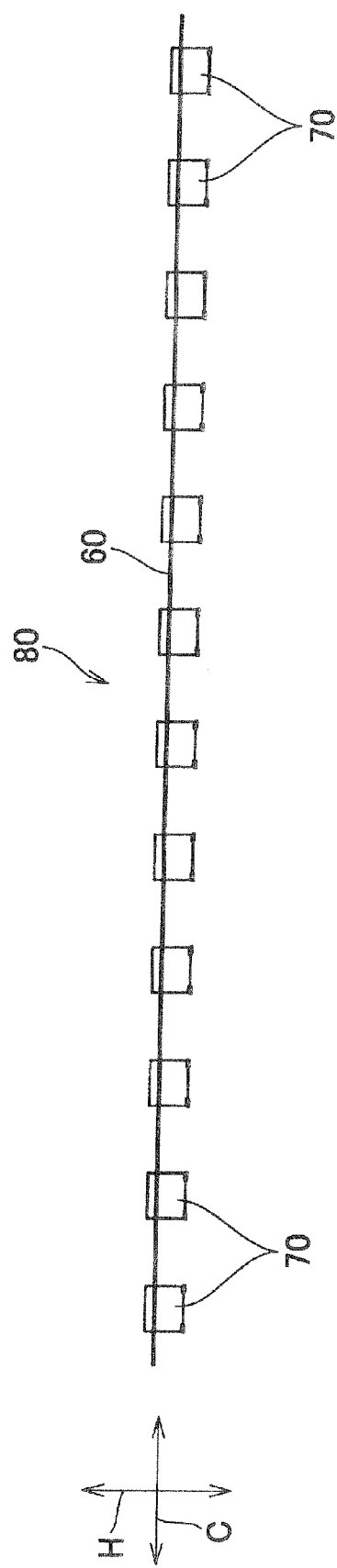
FIG. 2 is a side view of the semiconductor device package assembly shown in FIG. 1.
Figure 3:
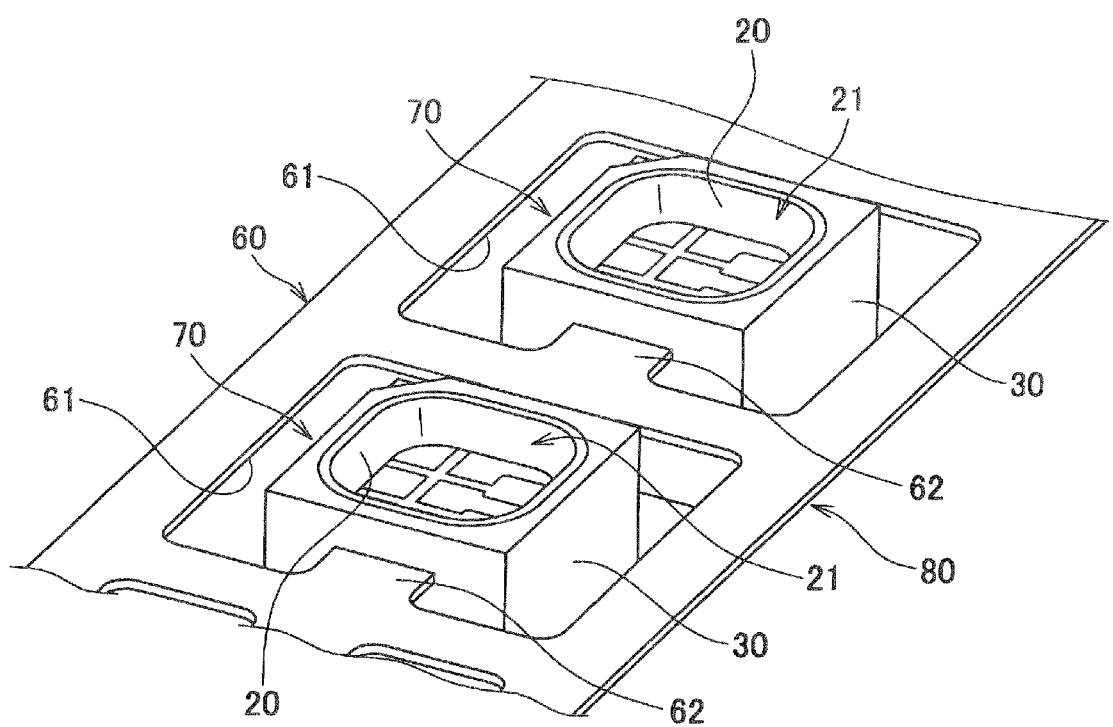
FIG. 3 is an enlarged perspective view of part A of the semiconductor device package assembly shown in FIG. 1.

The present invention will now be described in detail with reference to the drawings showing preferred embodiments thereof.

Referring to FIGS. 1 to 6, a semiconductor device package assembly 80 according to an embodiment of the present invention comprises a plurality of semiconductor device packages 70, and a secondary molding carrier 60.

Each semiconductor device package 70 is formed by a plurality of contacts 10, a first housing 20, and a second housing 30.

Figure 6:
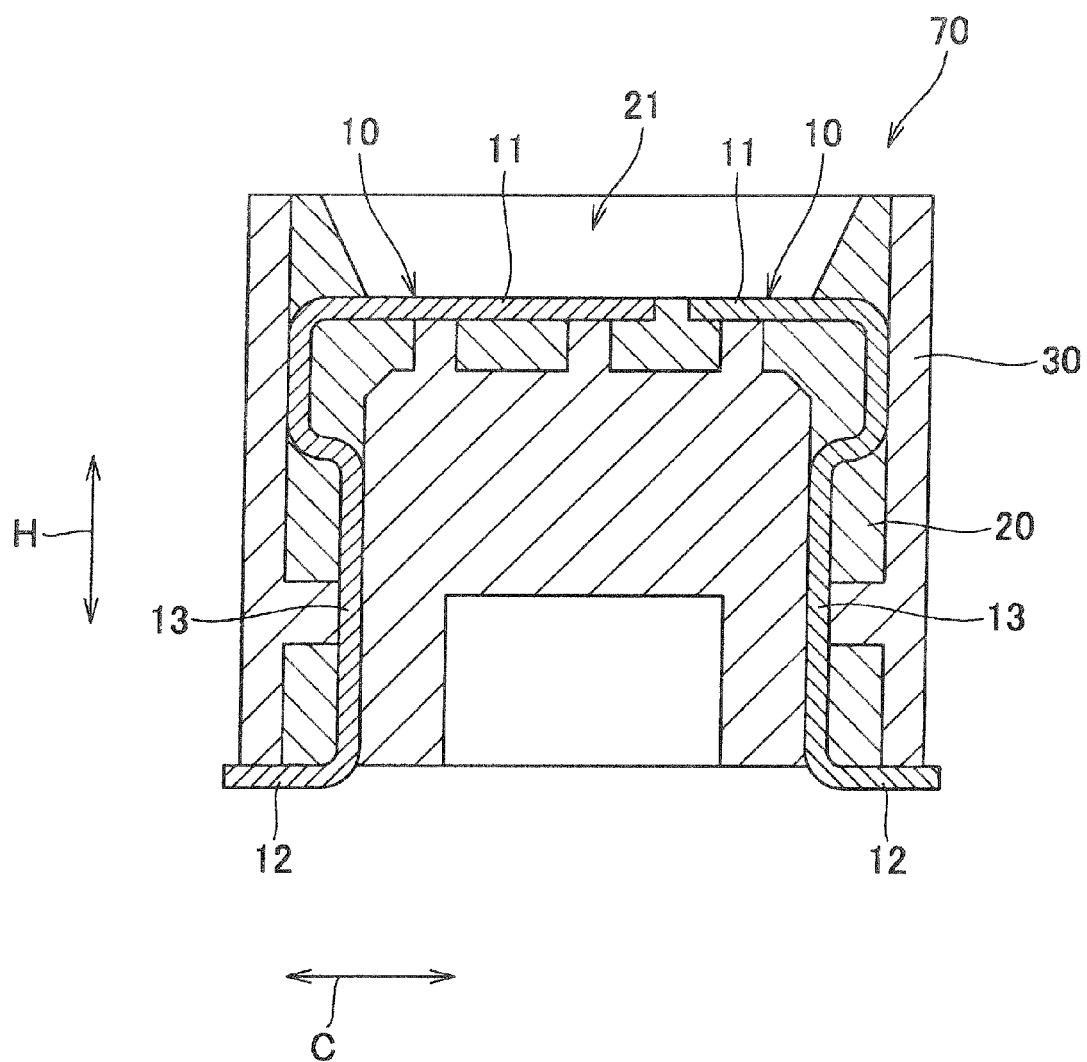
FIG. 6 is a cross-sectional view taken along VI-VI of FIG. 4.

As shown in FIG. 6, each contact 10 includes a first connection portion 11, a second connection portion 12, and a linking portion 13. For example, each contact 10 is silver-plated. The contact 10 has a thickness dimension (e.g. 0.15 mm) which is smaller than that (e.g. 0.2 mm) of the secondary molding carrier 60, referred to hereinafter. Although the plurality of contacts 10 include six types of contacts 10 (see FIGS. 7 and 8), these are mainly different from each other only in the shape of the first connection portion 11, and hence description of the contact 10 on a type basis is omitted.

A light emitting diode (semiconductor device) 100 (see FIG. 25) is mounted on the first connection portion 11. The light emitting diode 100 is electrically connected to the first connection portion 11 by a bonding wire (not shown). The light emitting diode 100 includes three types, i.e. red, green, and blue light emitting diodes. The first connection portion 11 is exposed in an accommodation cavity 21, referred to hereinafter. The second connection portion 12 is electrically connected to a printed board (substrate) 200 (see FIG. 26) by soldering. The second connection portion 12 is exposed outward from respective lower portions of the first and second housings 20 and 30. The linking portion 13 links the first connection portion 11 and the second connection portion 12.

The linking portion 13 extends in a height direction H of the first housing 20, and the first and second connection portions 11 and 12 extend in a direction C orthogonal to the height direction H.

The linking portion 13 is sandwiched between the first housing 20 and the second housing 30.

Figure 15:
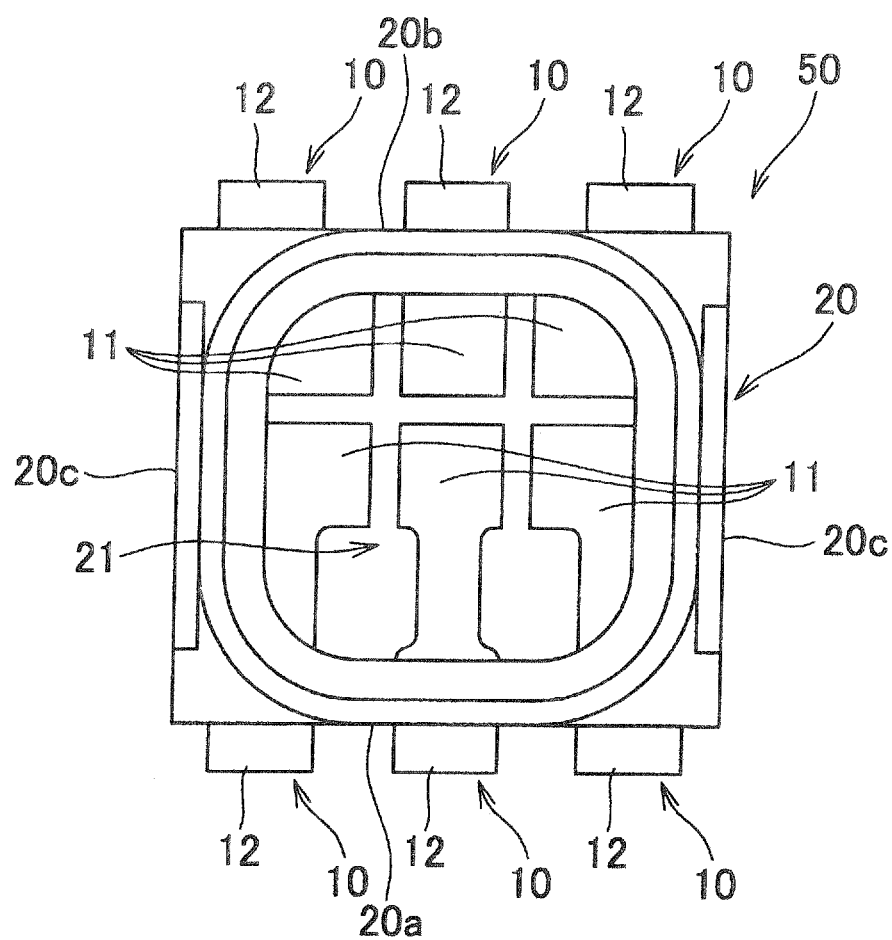
FIG. 15 is a plan view of the package intermediate shown in FIG. 13.
Figure 16:
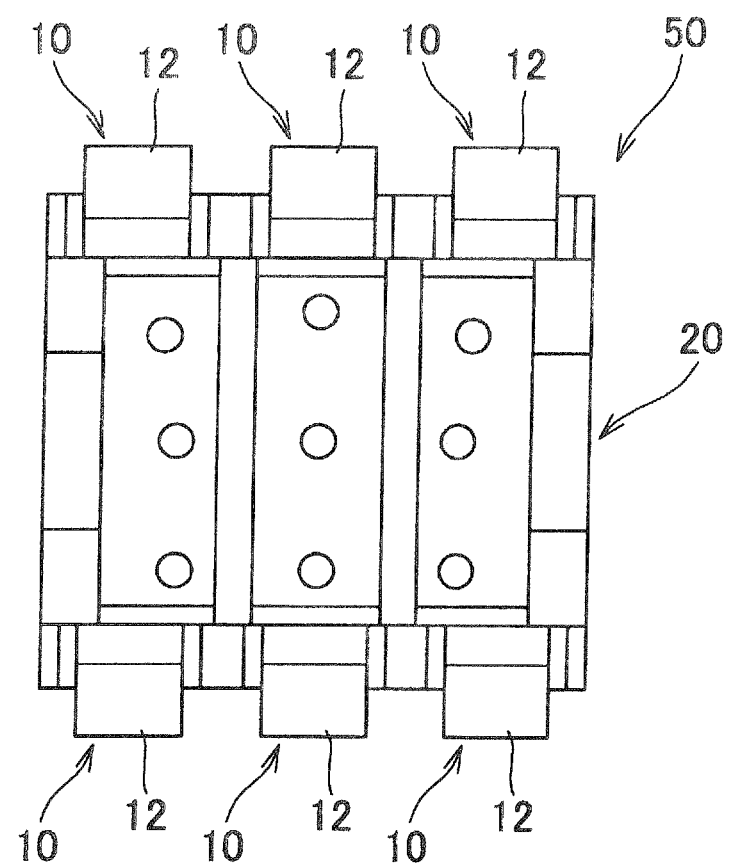
FIG. 16 is a bottom view of the package intermediate shown in FIG. 13.
Figure 17:
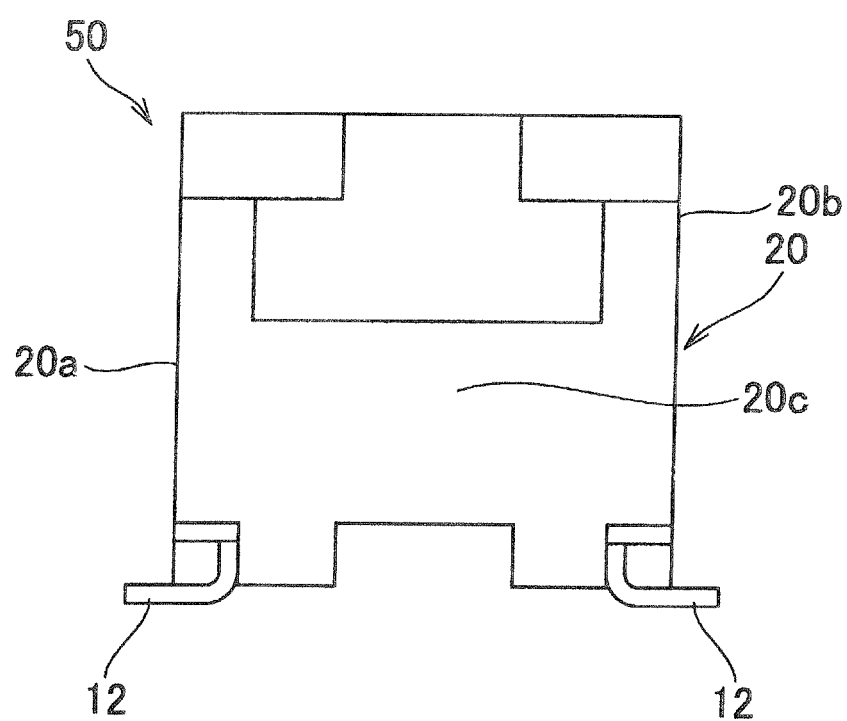
FIG. 17 is a side view of the package intermediate shown in FIG. 13.
Figure 18:
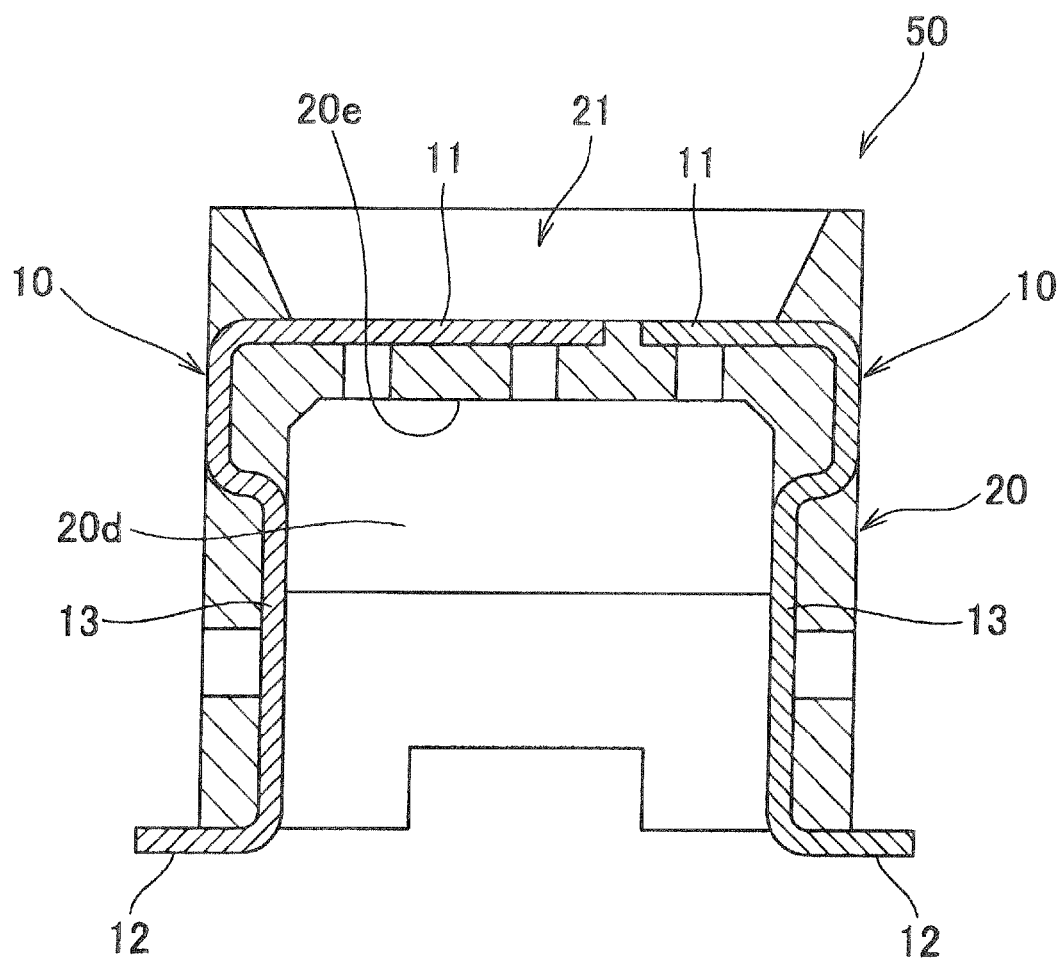
FIG. 18 is a cross-sectional view of the package intermediate taken along XVIII-XVIII of FIG. 14.

As shown in FIGS. 3, 4, 5, and 6, the first housing 20 is casing-shaped, and defines a space therein (see FIG. 18). Further, the first housing 20 has an upper portion formed with the accommodation cavity 21 for accommodating the light emitting diodes 100. The first housing 20 is molded of light-colored resin, such as white resin. The second housing 30 covers an outer peripheral surface (predetermined area) of the first housing 20 and an inner wall surface (predetermined area) of the first housing 20. The outer peripheral surface of the first housing 20 includes a front surface 20a, a rear surface 20b, and opposite side surfaces 20c of the first housing 20 (see FIG. 15). The inner wall surface of the first housing 20 includes an inner peripheral surface 20d and a ceiling surface 20e of the first housing 20 (see FIG. 18). The second housing 30 is molded of dark-colored resin, such as black resin. The contacts 10 are integrated with the first housing 20 and the second housing 30 by insert molding.

The secondary molding carrier 60 has housing accommodation holes 61 and protrusions 62. Each housing accommodation hole 61 accommodates the first housing 20 and the second housing 30. Each pair of opposed ones of the protrusions 62 support the second housing 30.

The secondary molding carrier 60 is formed by blanking a metal plate. The secondary molding carrier 60 is not plated.

Next, a description will be given of a method of manufacturing a light emitting device (semiconductor device) 120.

Figure 7:
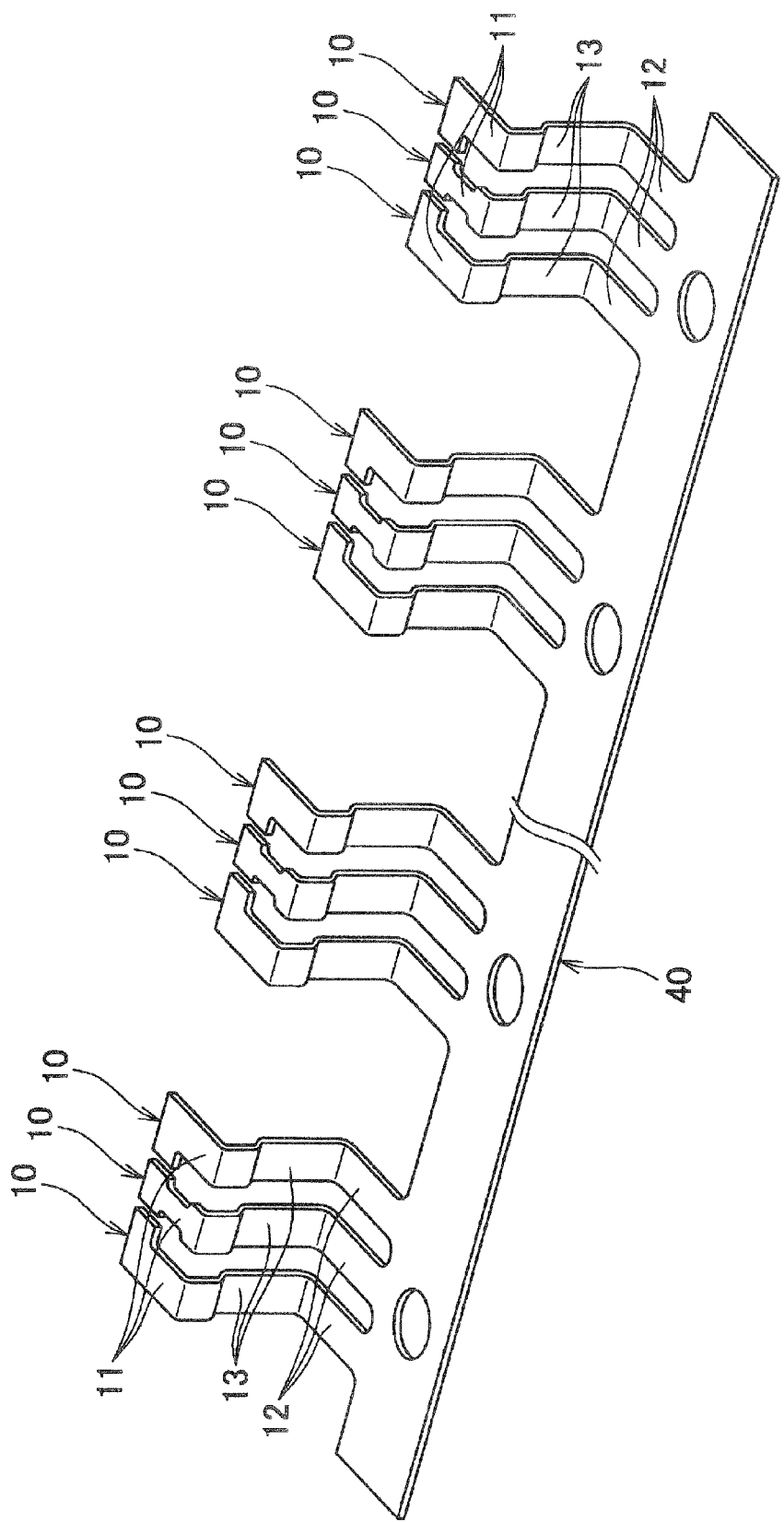
FIG. 7 is a perspective view of contacts supported by a primary molding carrier.
Figure 8:
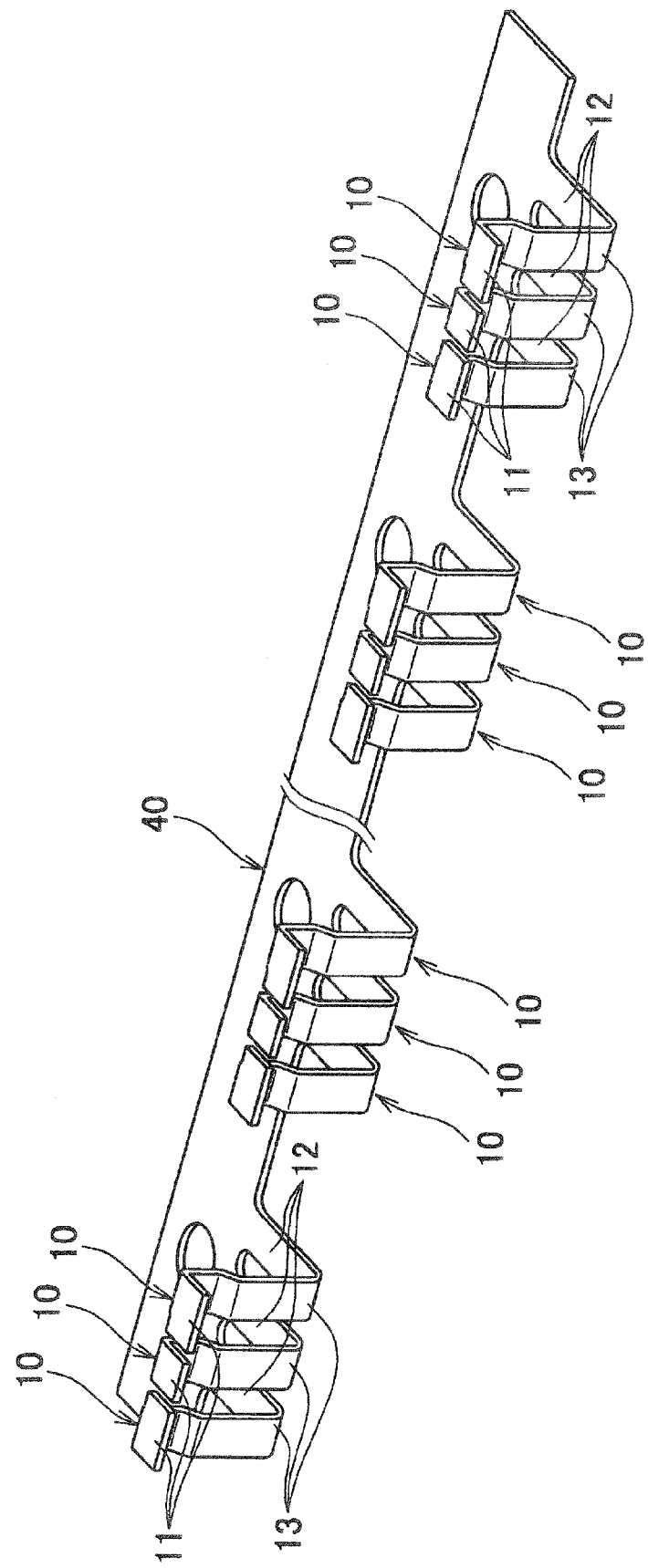
FIG. 8 is a perspective view of contacts supported by the primary molding carrier, which are combined with the contacts shown in FIG. 7.

First, the plurality of contacts 10 shown in FIGS. 7 and 8 are formed by blanking and bending a metal plate (not shown). At this time, the plurality of contacts 10 and a primary molding carrier 40 are integrally connected. The primary molding carrier 40 continues to the second connection portion 12 of each contact 10.

Figure 9:
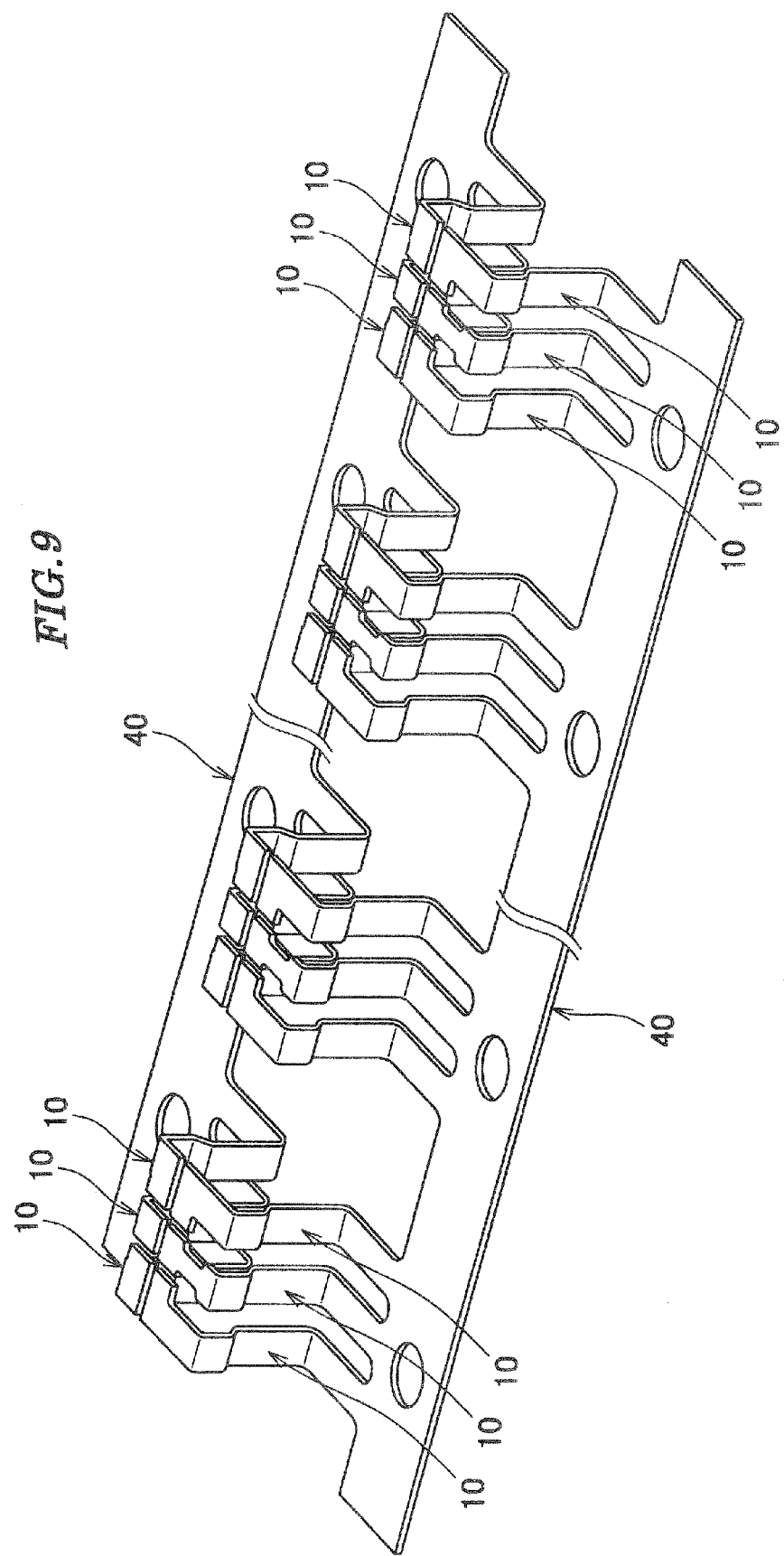
FIG. 9 is a perspective view showing a state in which the contacts shown in FIG. 7 and the contacts shown in FIG. 8 are opposed to each other.
Figure 10:
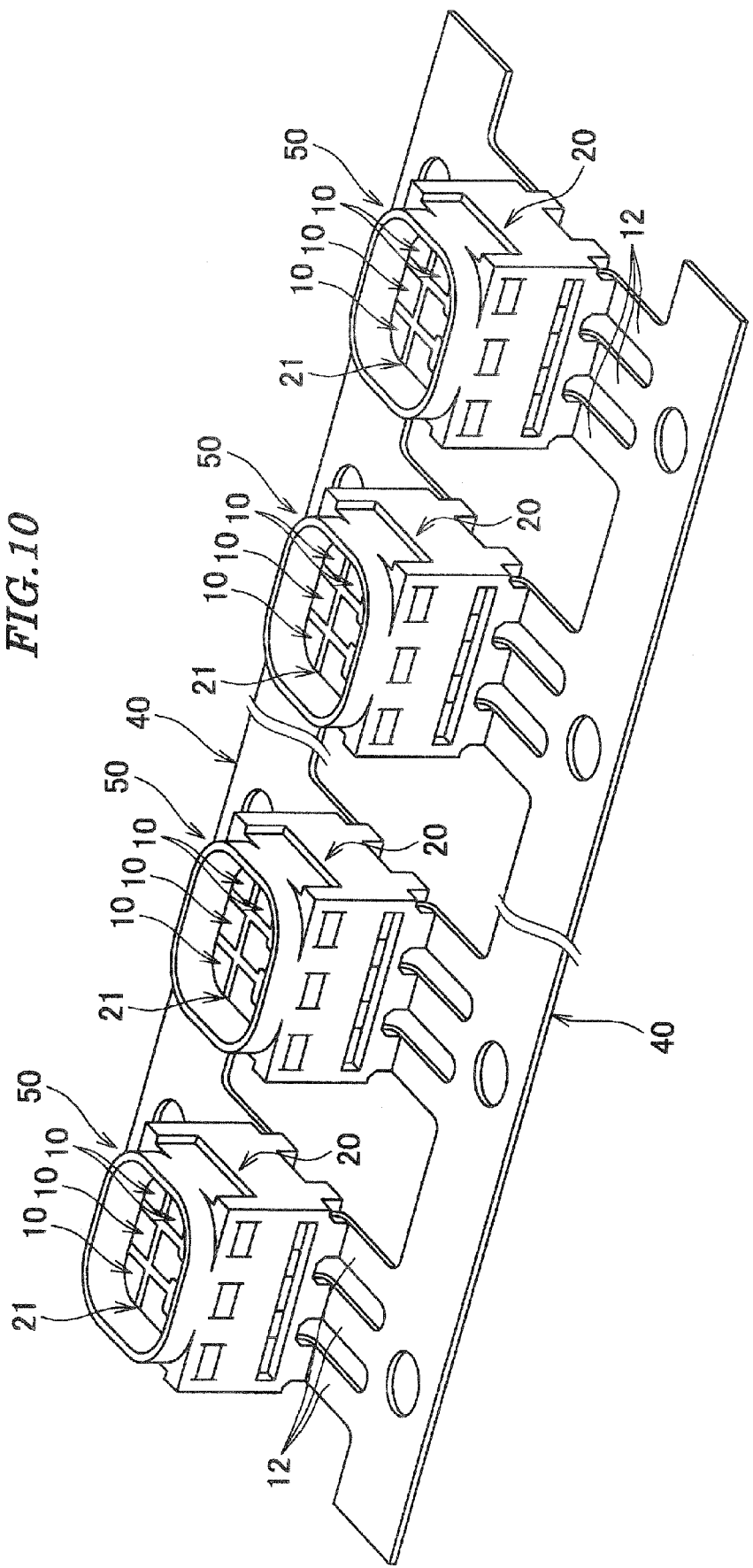
FIG. 10 is a perspective view of package intermediates each formed by integrating the contacts and a first housing by insert molding.
Figure 11:
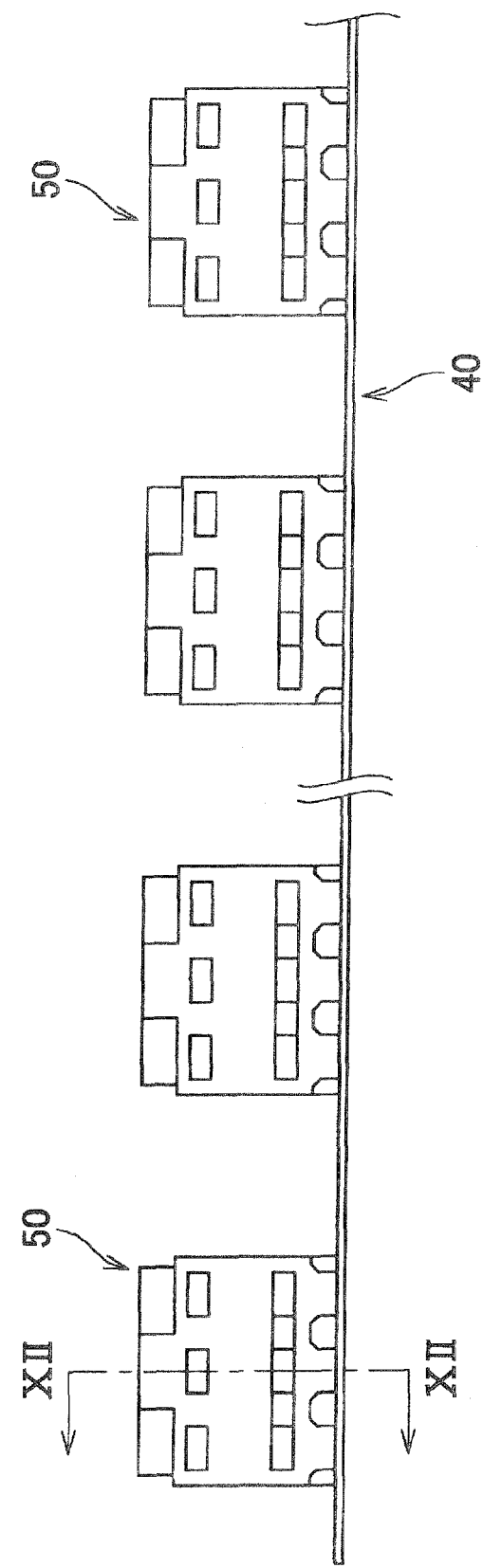
FIG. 11 is a side view of the package intermediates.
Figure 12:
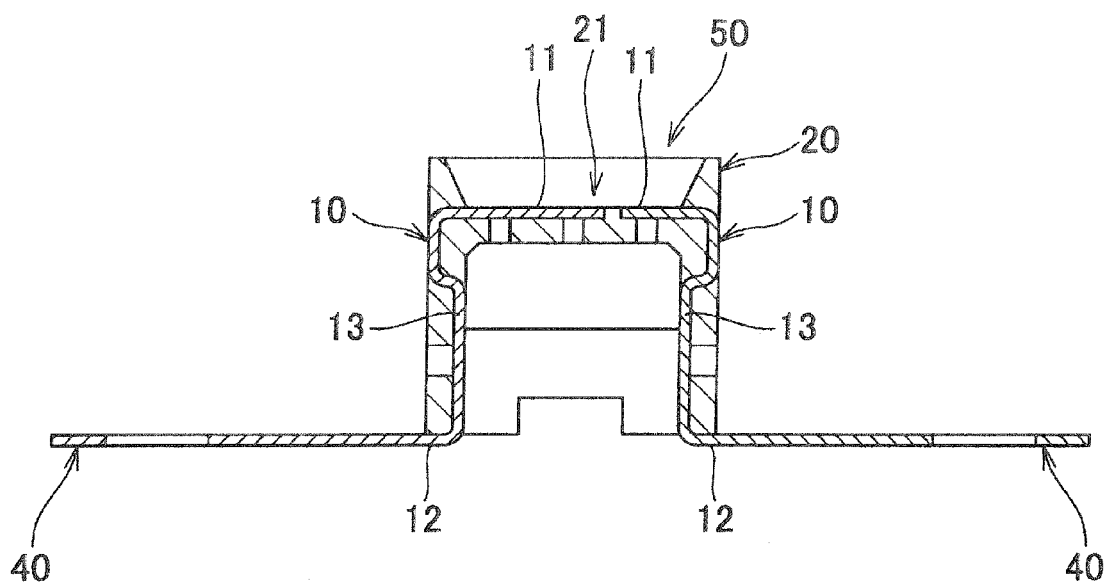
FIG. 12 is a cross-sectional view taken along XII-XII of FIG. 11.
Figure 13:
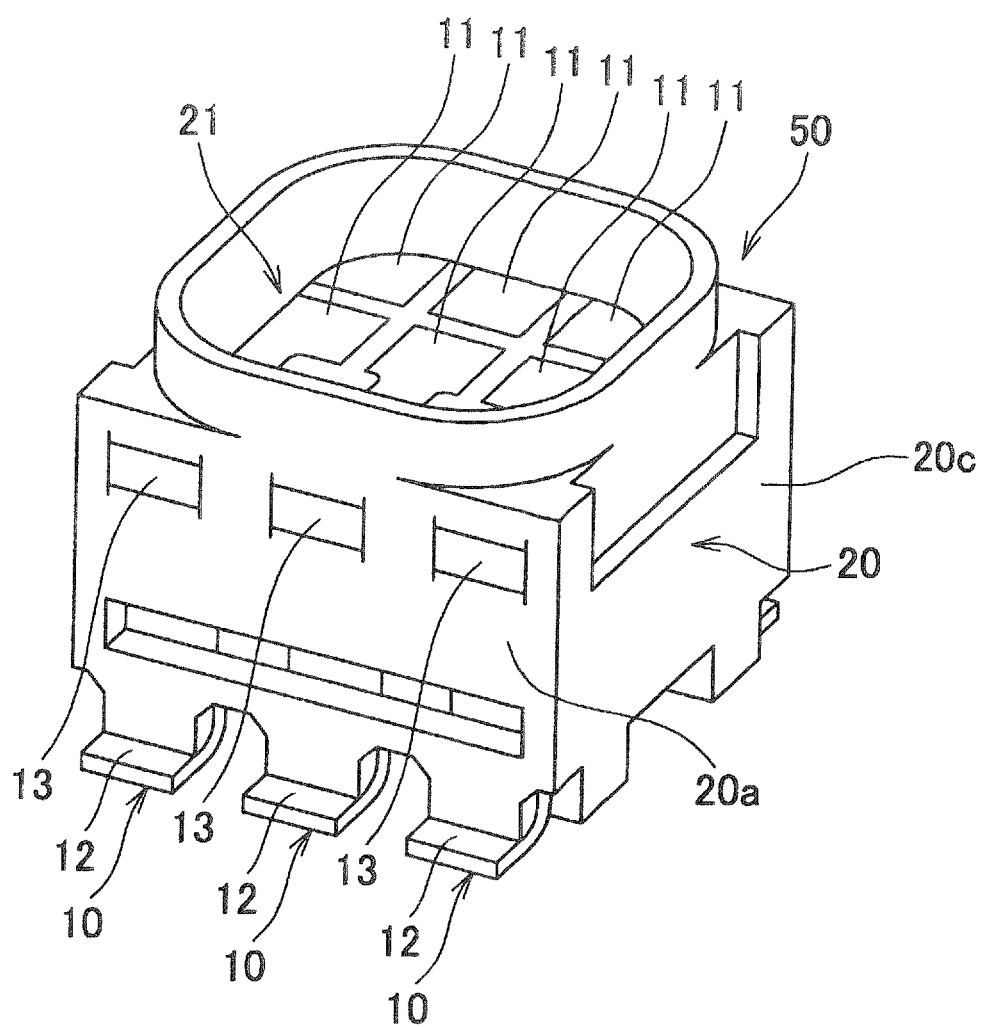
FIG. 13 is a perspective view of each package intermediate separated from the primary molding carrier appearing in FIG. 10.
Figure 14:
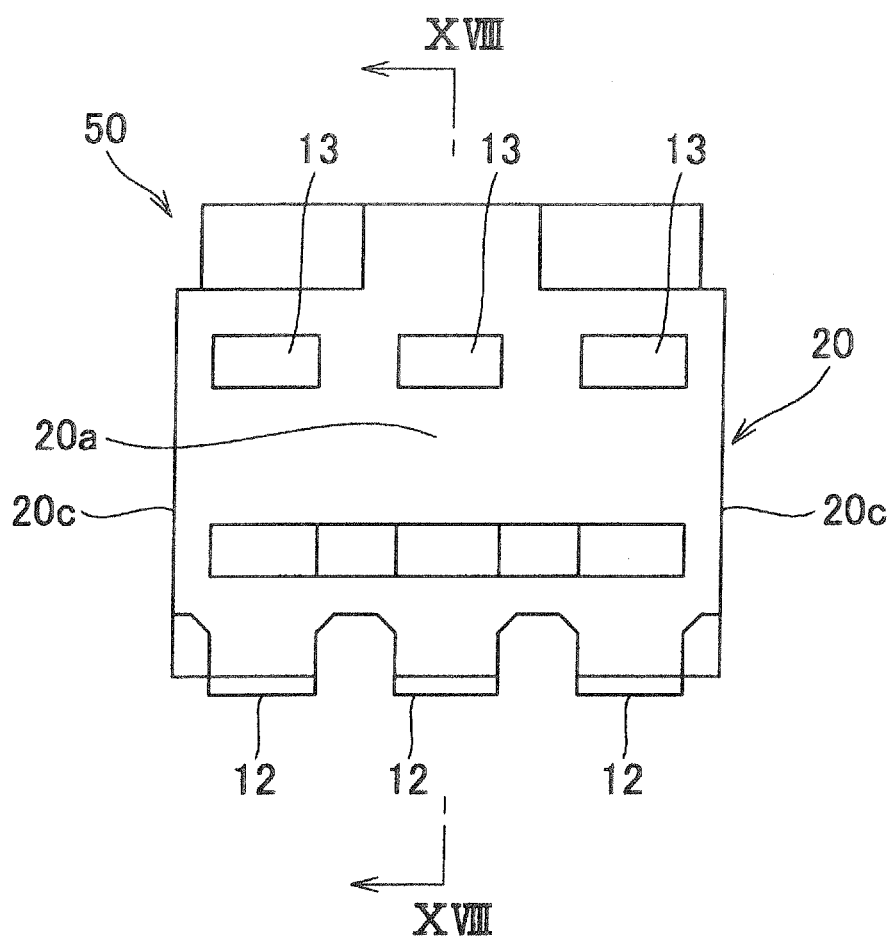
FIG. 14 is a front view of the package intermediate shown in FIG. 13.

Next, as shown in FIG. 9, the plurality of contacts 10 supported by the primary molding carrier 40 are arranged on a lower mold of a mold for primary molding (not shown), an upper mold is combined with the lower mold, and resin in a fluid state is filled in a cavity formed by the lower mold and the upper mold and is cured to thereby form the first housings 20 appearing in FIGS. 10, 11, and 12 (primary molding process). One package intermediate 50 is formed by six contacts 10 and one first housing 20.

Then, the primary molding carrier 40 supporting the contacts 10 of the package intermediates 50 is cut off (primary molding carrier-removing process). As a result, there are obtained the package intermediates 50 each in a single state shown in FIGS. 13 to 18.

Figure 19:
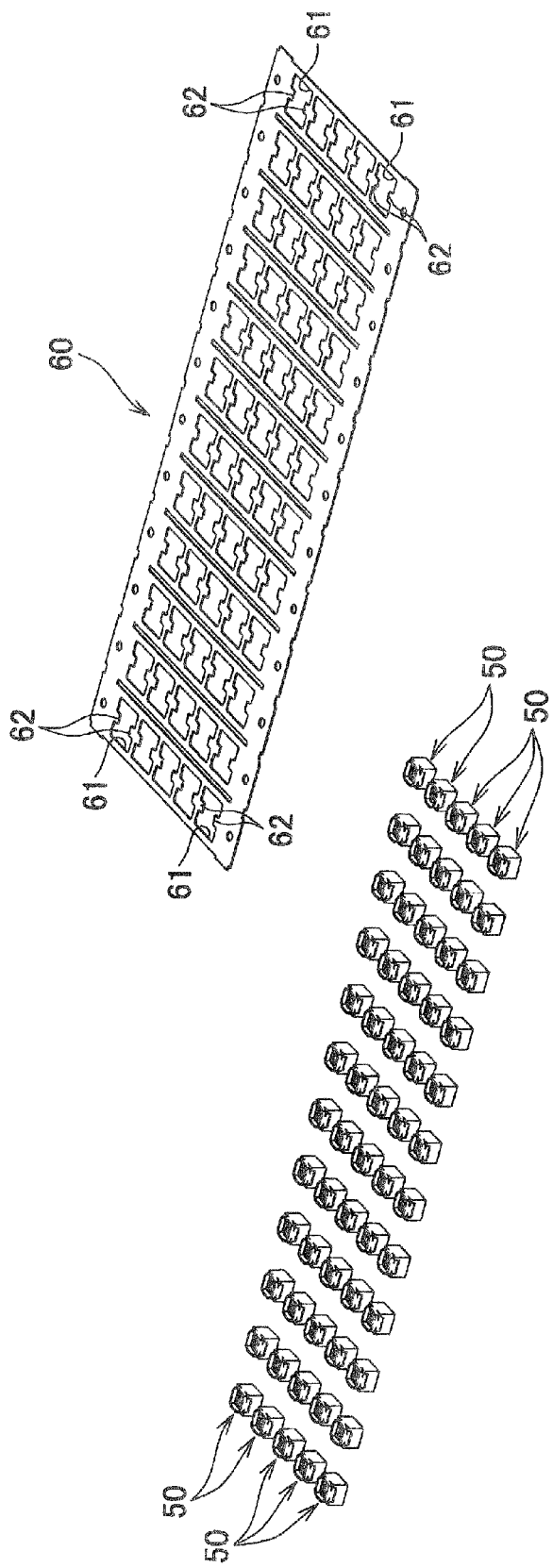
FIG. 19 is a perspective view showing a state before the package intermediates are accommodated in housing accommodation holes of a secondary molding carrier.
Figure 20:
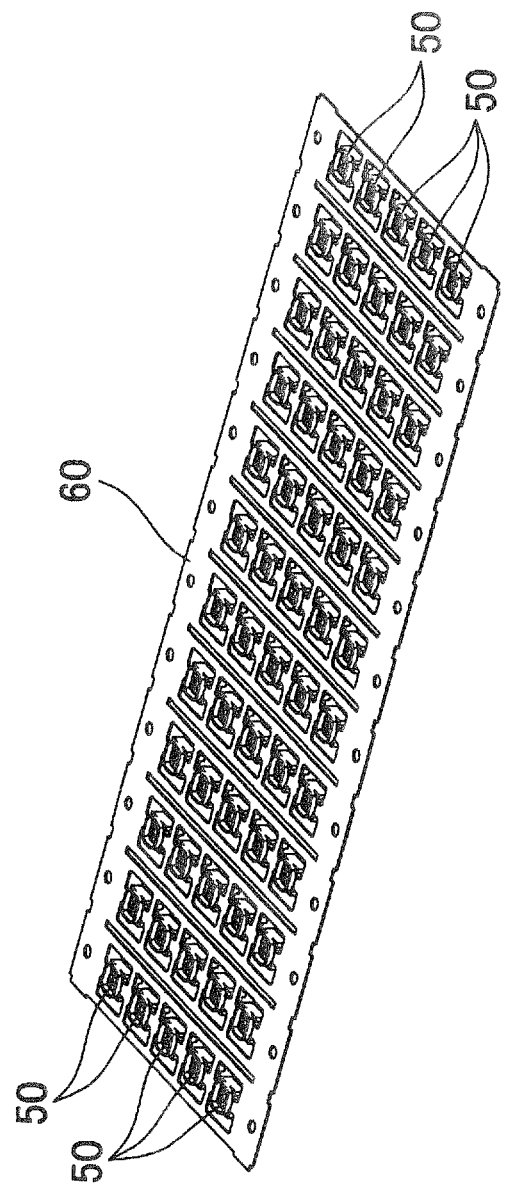
FIG. 20 is a perspective view showing a state in which the package intermediates are accommodated in the housing accommodation holes of the secondary molding carrier.
Figure 21:
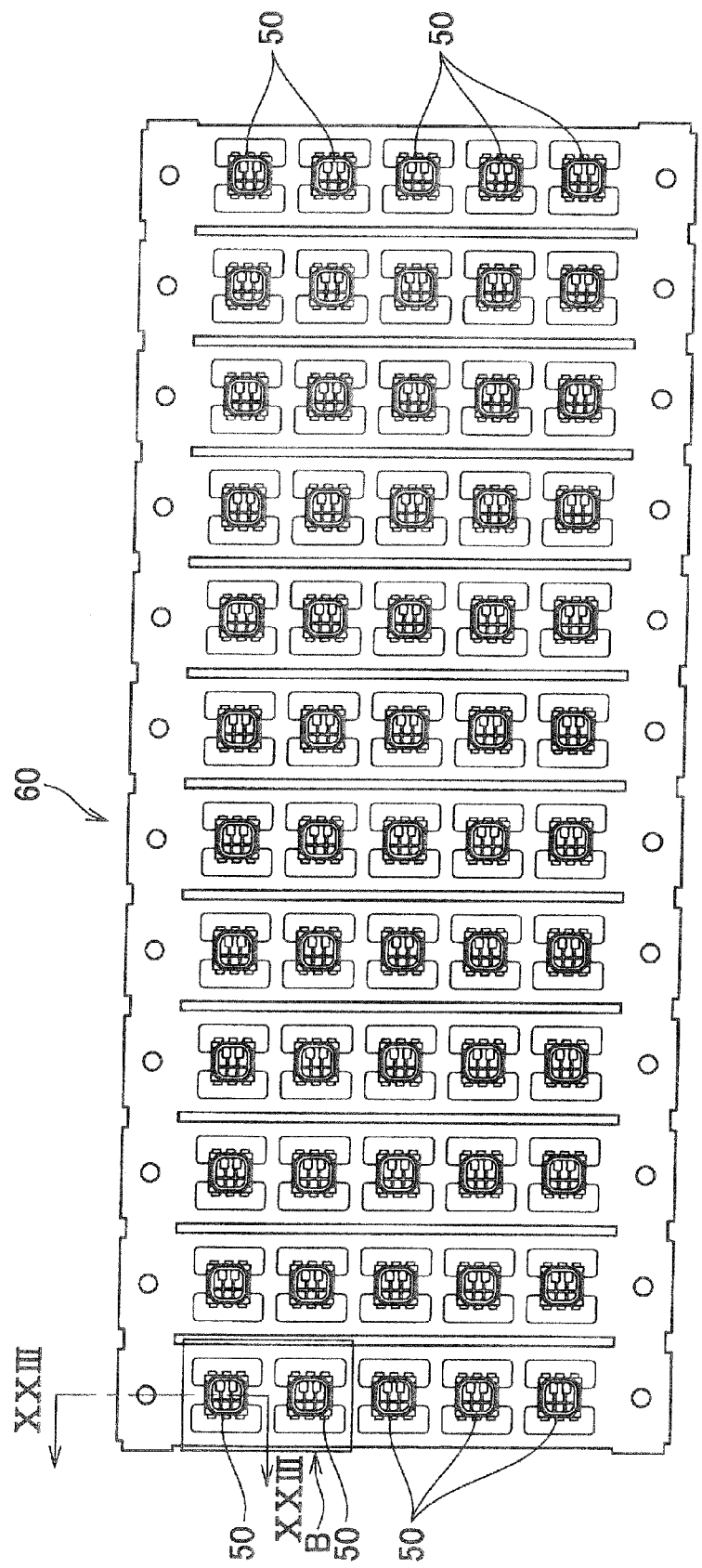
FIG. 21 is a plan view showing the state in which the package intermediates are accommodated in the housing accommodation holes of the secondary molding carrier.
Figure 22:
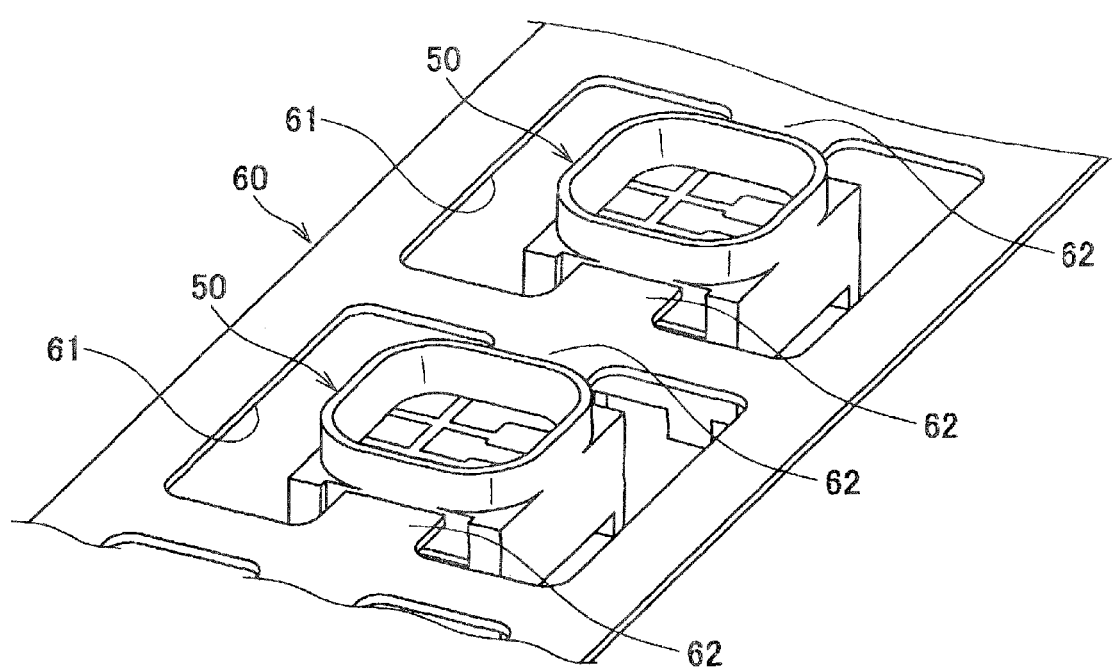
FIG. 22 is an enlarged perspective view of part B in FIG. 21.
Figure 23:
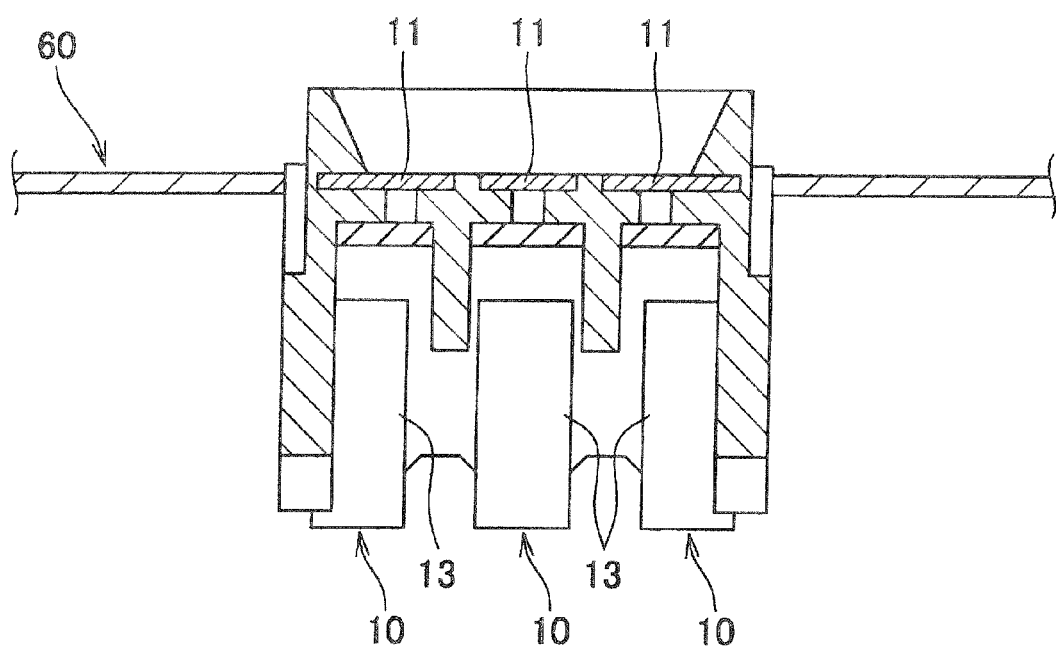
FIG. 23 is a cross-sectional view taken along XXIII-XXIII of FIG. 21.

Next, the process is shifted to a secondary molding process, and a plurality of package intermediates 50 are arrayed in a lower mold of a mold for secondary molding (not shown) (see FIG. 19).

Thereafter, as shown in FIG. 19, the secondary molding carrier 60 is placed over the arrayed package intermediates 50 from above to accommodate the package intermediates 50 in the plurality of housing accommodation holes 61 of the secondary molding carrier 60, respectively, as shown in FIGS. 20, 21, 22, and 23.

Figure 4:
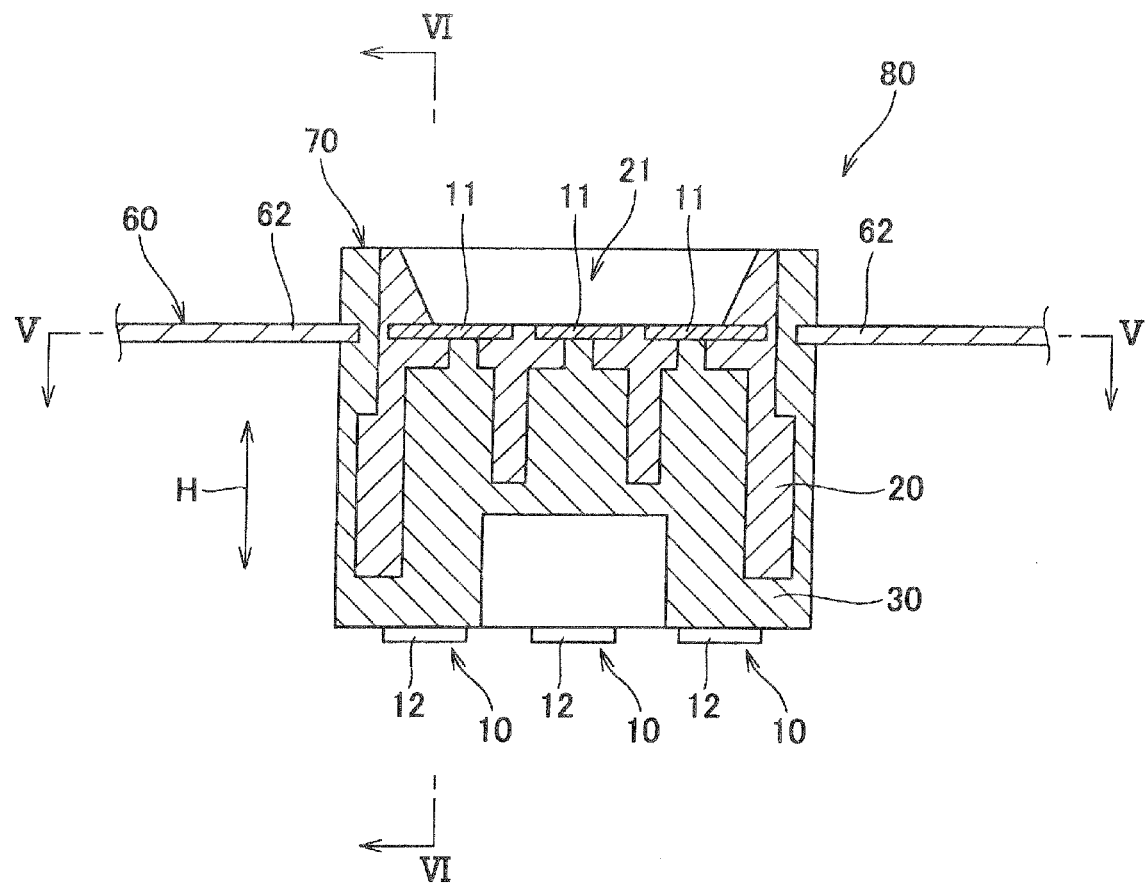
FIG. 4 is a cross-sectional view taken along IV-IV of FIG. 1.
Figure 5:
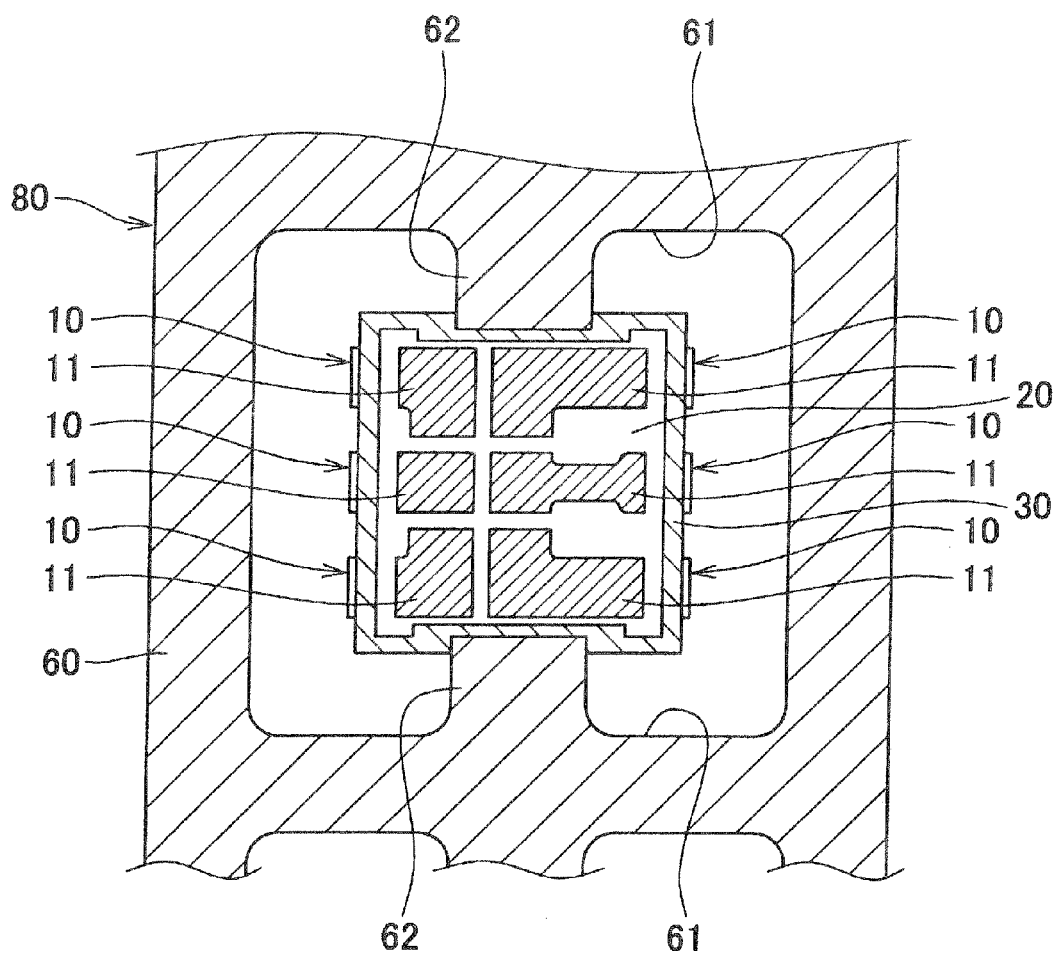
FIG. 5 is a cross-sectional view taken along V-V of FIG. 4.

Next, an upper mold of the mold for secondary molding is combined with the lower mold, and black-colored resin in a fluid state is filled in a cavity formed by the lower mold and the upper mold and is cured to thereby form the second housings 30 appearing in FIG. 4. At this time, the outer peripheral surface and the inner wall surface of each first housing 20 is covered with the black-colored resin. The plurality of semiconductor device packages 70 (see FIG. 3) which are supported by the secondary molding carrier 60 in high density are thus formed, and the secondary molding process is terminated.

By execution of the above-described processes, the semiconductor device package assembly 80 comprising the secondary molding carrier 60 and the plurality of semiconductor device packages 70 is completed (see FIGS. 1 to 4).

Figure 24:
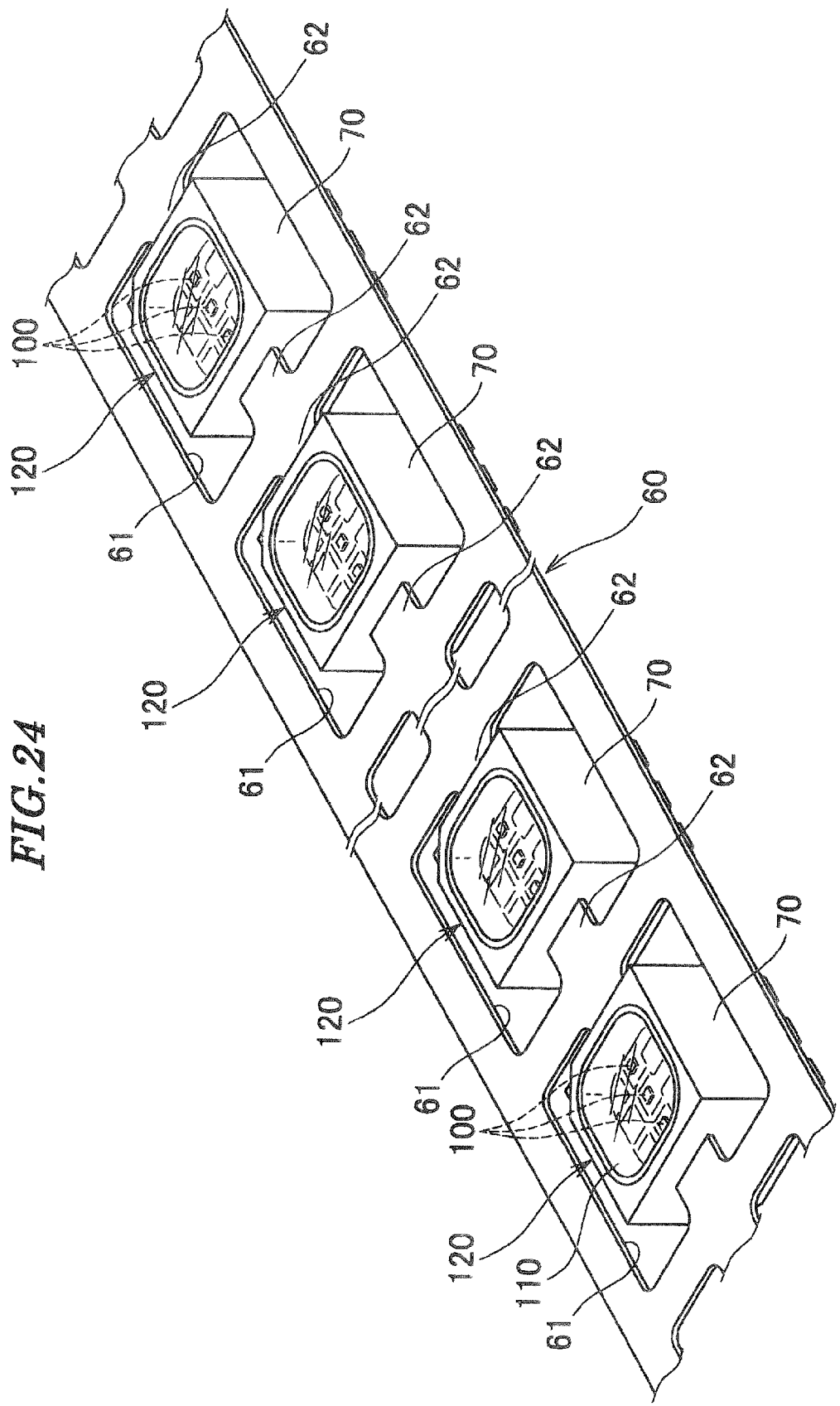
FIG. 24 is a perspective view showing a state in which transparent resin is filled into cavities for accommodating semiconductor device packages after mounting light emitting diodes on each semiconductor device package shown in FIG. 3.

Next, the light emitting diodes 100 (see FIGS. 24 and 25) are connected to the first connection portions 11 exposed in the accommodation cavity 21 using a mounter, not shown, and transparent resin 110 in a fluid state is filled in the accommodation cavity 21, and is cured to thereby seal the light emitting diodes 100 in the accommodation cavity 21, as shown in FIG. 24 (semiconductor element-mounting process). As a result, as shown in FIG. 24, an assembly of the light emitting devices 120 supported by the secondary molding carrier 60 is completed.

Figure 25:
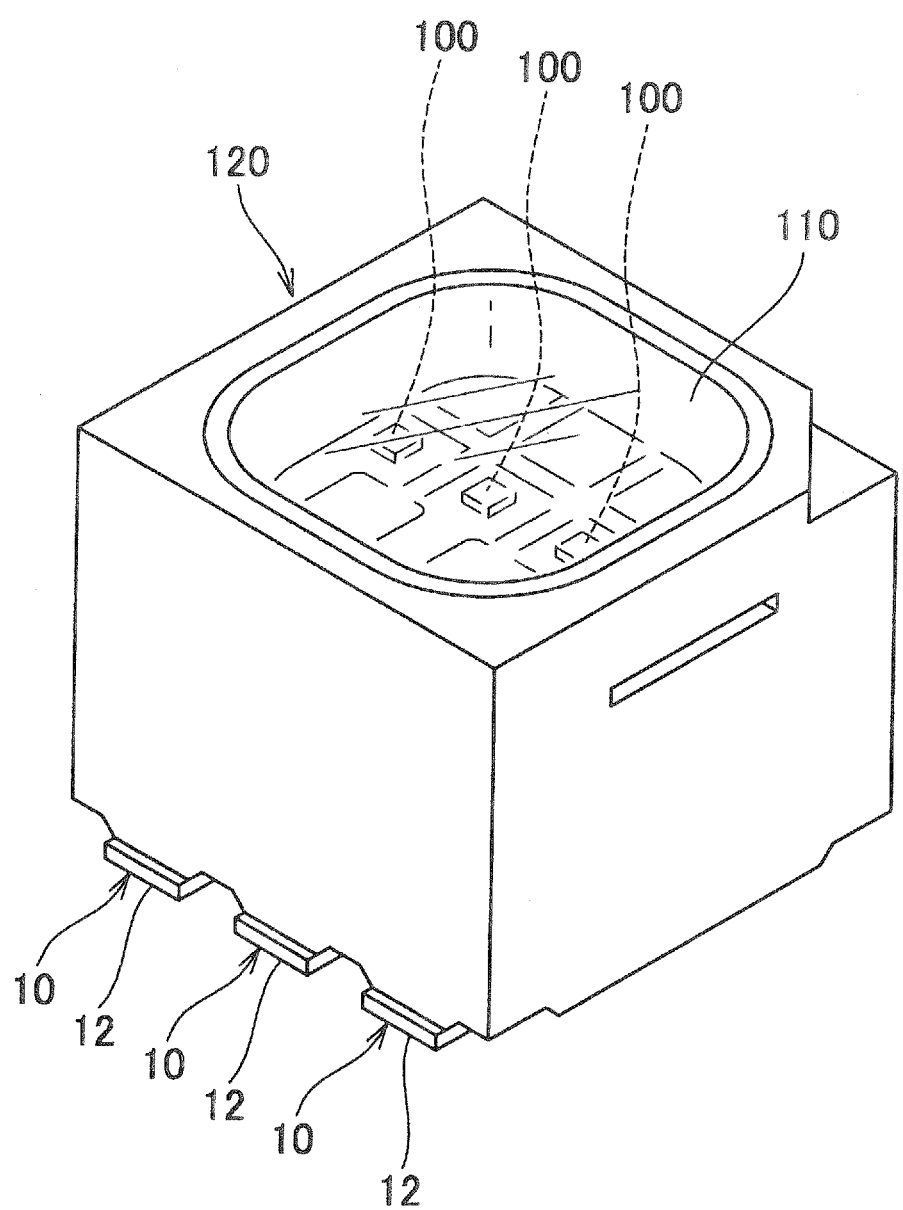
FIG. 25 is a perspective view of a light emitting device removed from the secondary molding carrier appearing in FIG. 24.

Finally, the light emitting devices 120 are each removed from the associated protrusions 62 of the secondary molding carrier 60 (secondary molding carrier-removing process). By execution of the above-described processes, the light emitting devices 120 each in a single state shown in FIG. 25 are obtained.

Next, a description will be given of a method of manufacturing a display device 300 using the light emitting devices 120.

Figure 26:
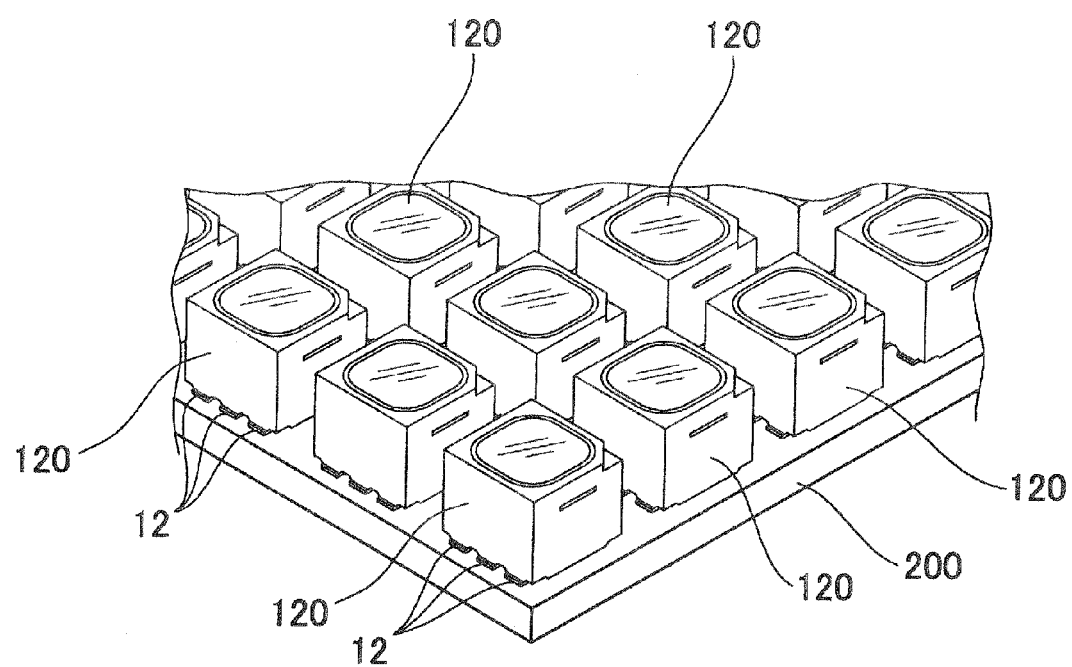
FIG. 26 is a perspective view showing a state in which the plurality of light emitting devices are mounted on a printed board.

First, as shown in FIG. 26, the light emitting devices 120 are arranged on the printed board 200 in a matrix, and are solder-mounted.

Figure 27:
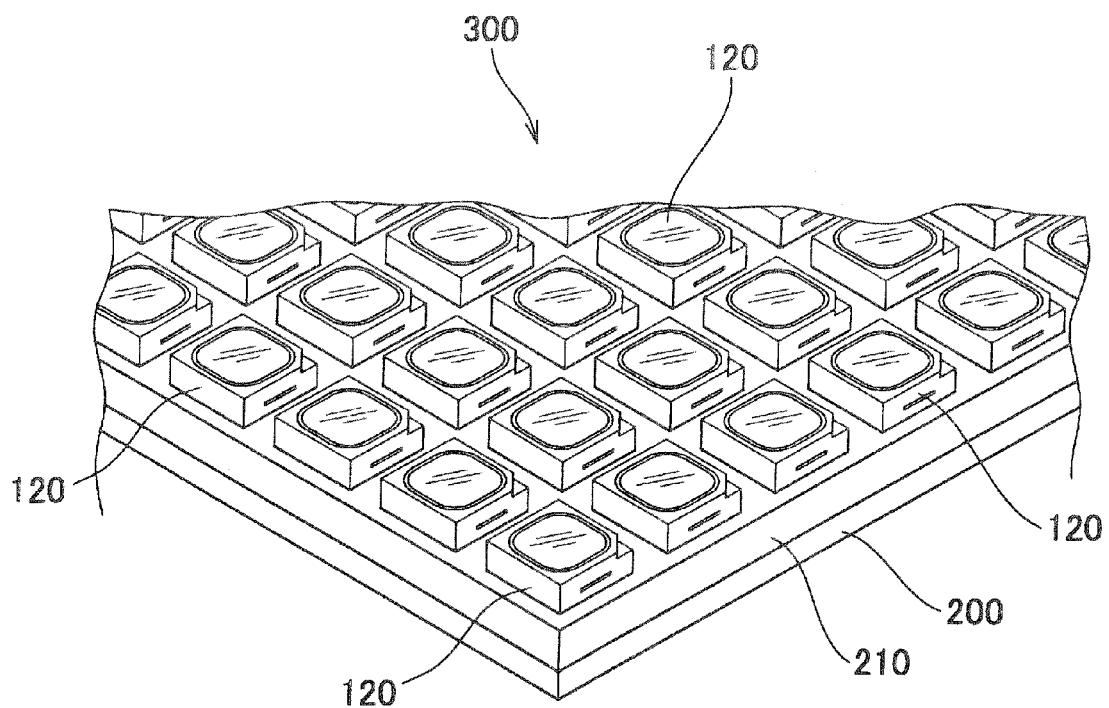
FIG. 27 is a perspective view showing a state in which black-colored resin is filled around the plurality of light emitting devices shown in FIG. 26.
Figure 28:
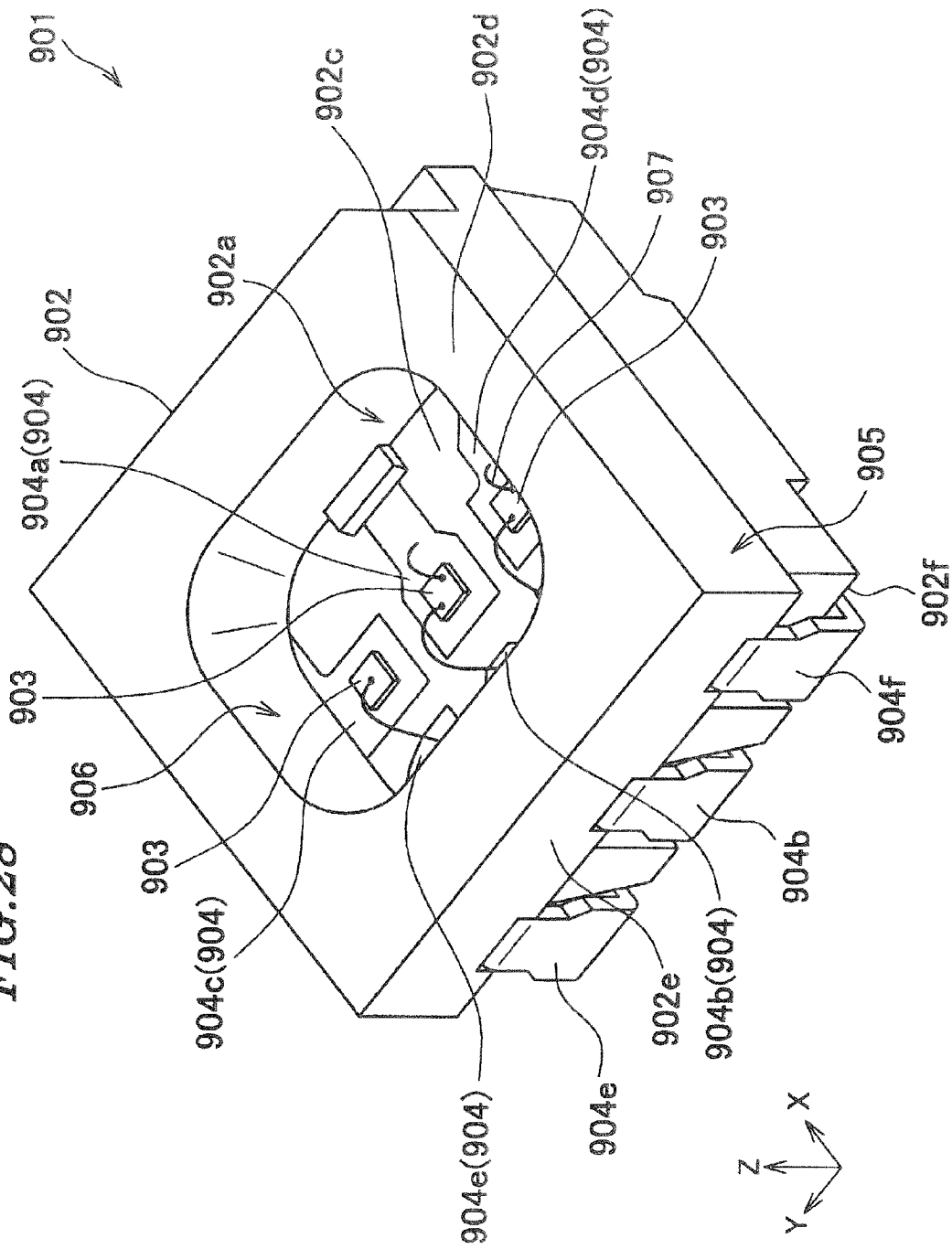
FIG. 28 is a perspective view of a conventional light emitting device.

Then, as shown in FIG. 27, dark-colored resin, such as black resin, in fluid state is filled around the light emitting devices 120 arranged on the printed board 200, and is cured to thereby form a black resin layer 210. Each light emitting device 120 has a large height dimension, and hence an operation error causing unintended attachment of black-colored resin to upper surfaces of the light emitting devices 120 is less liable to occur. By forming the black resin layer 210, it is possible to obtain high contrast when an image is displayed.

By execution of the above-described process, the display device 300 is completed.

The following advantageous effect is obtained by the present embodiment.

Figure 29:
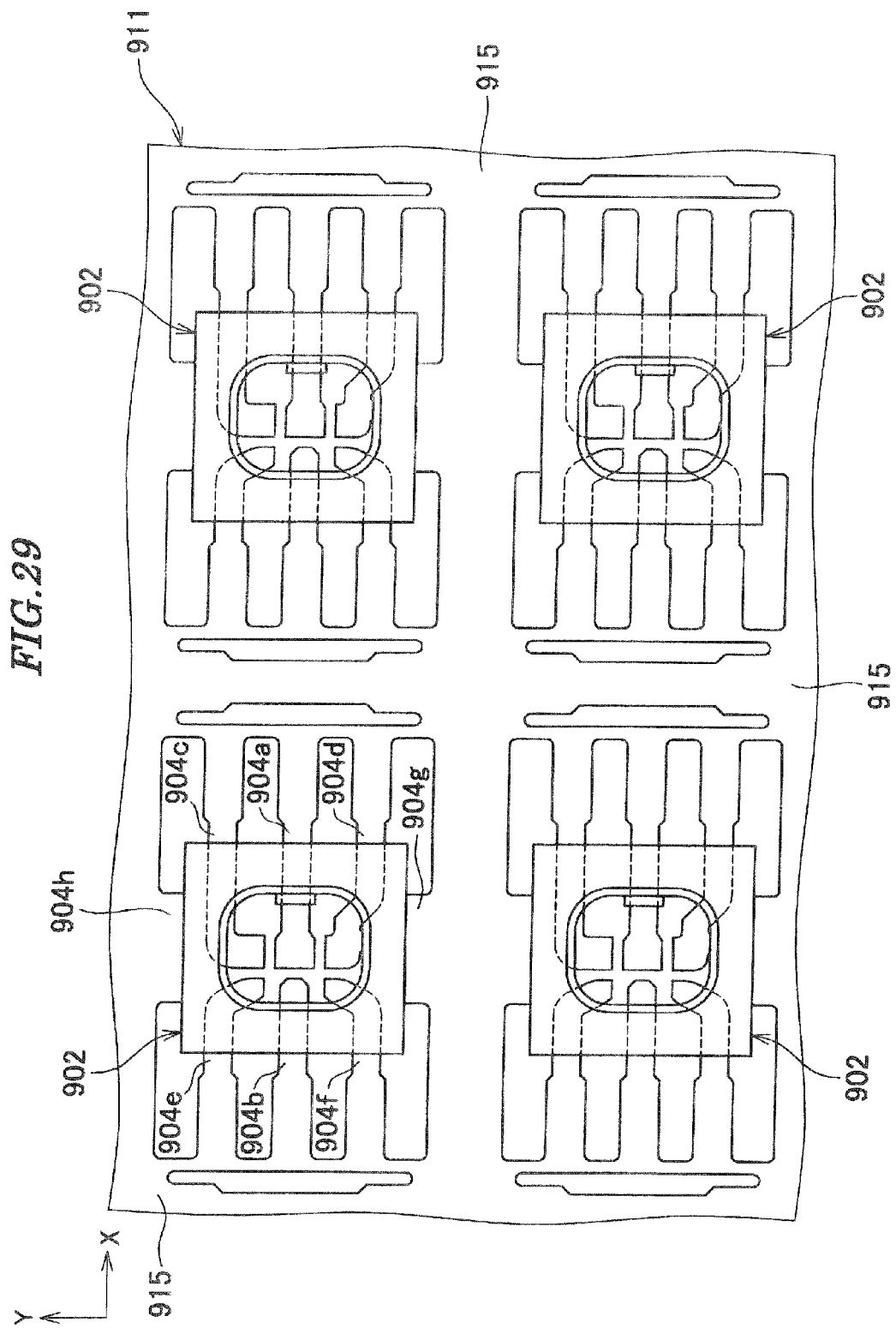
FIG. 29 is a plan view of an example of a package assembly during a process of manufacturing the conventional light emitting devices.
Figure 30A:
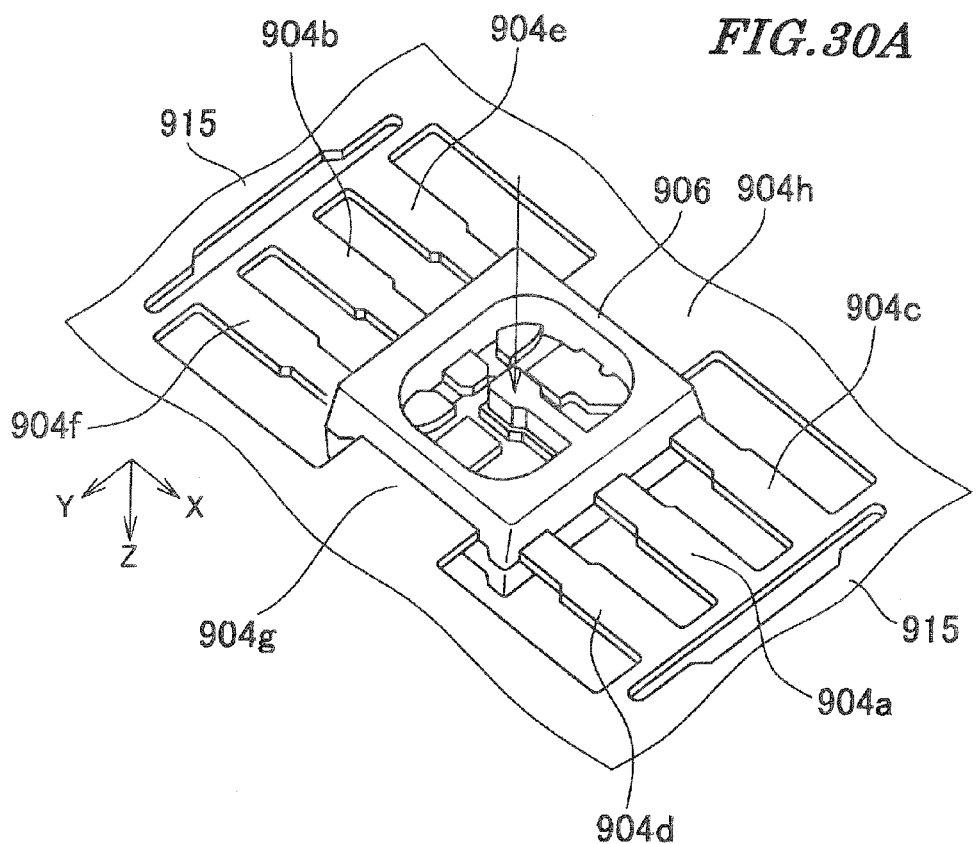
Figure 30B:
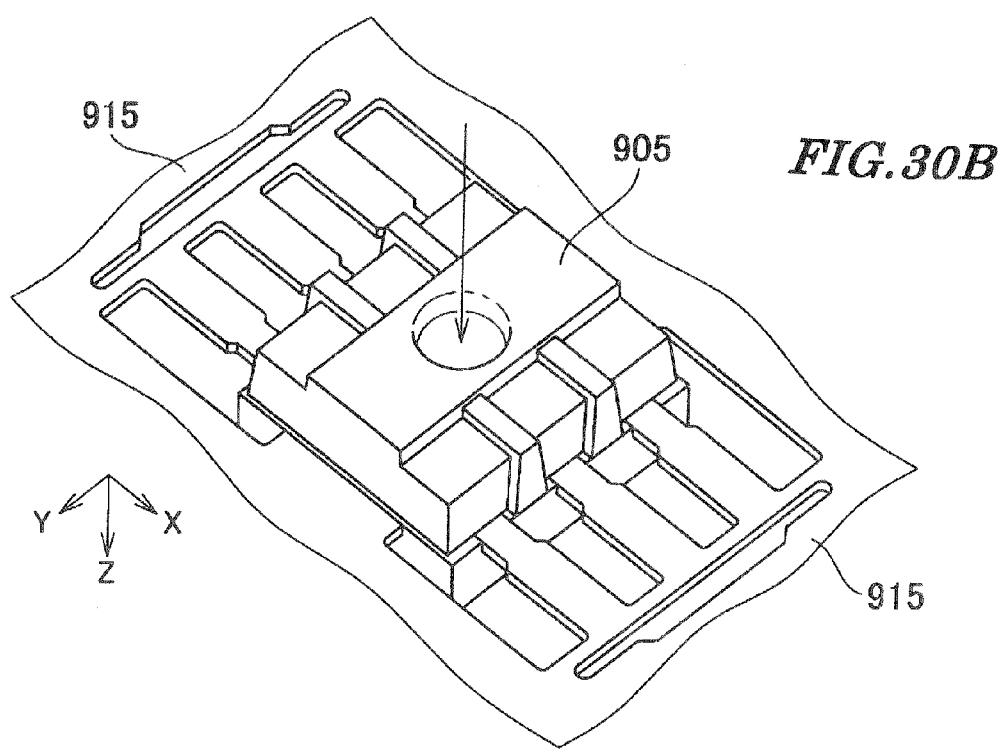
Figure 31A:
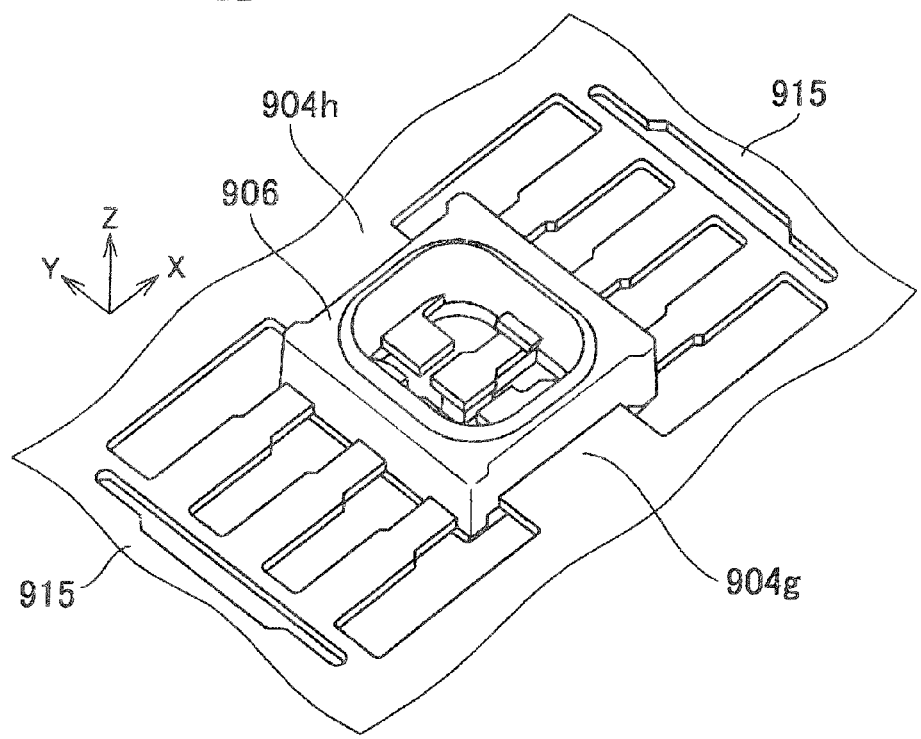
Figure 31B:
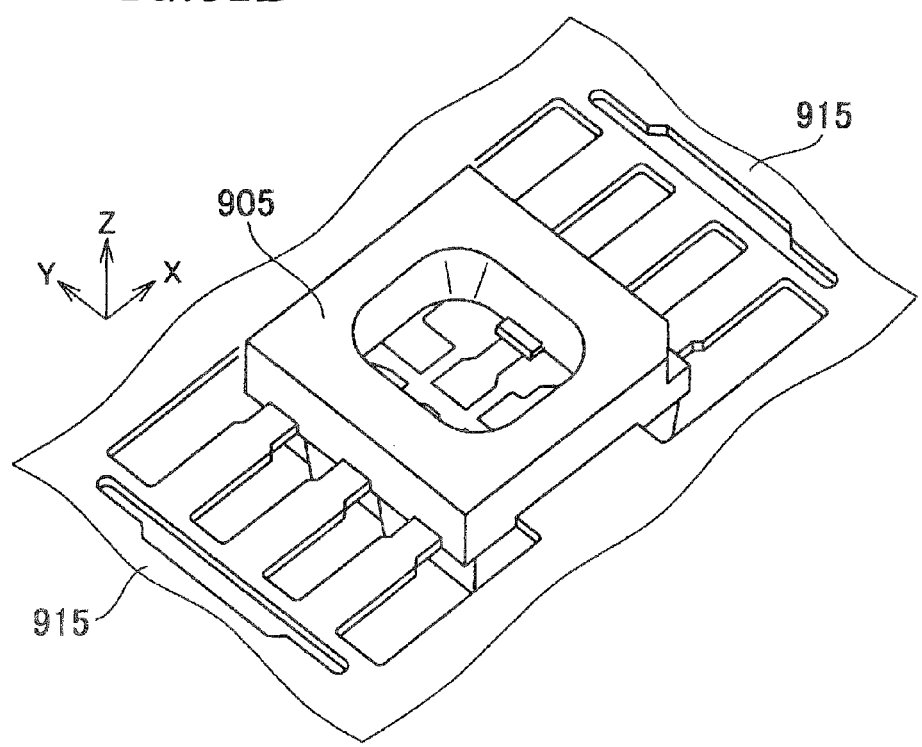
Figure 32A:
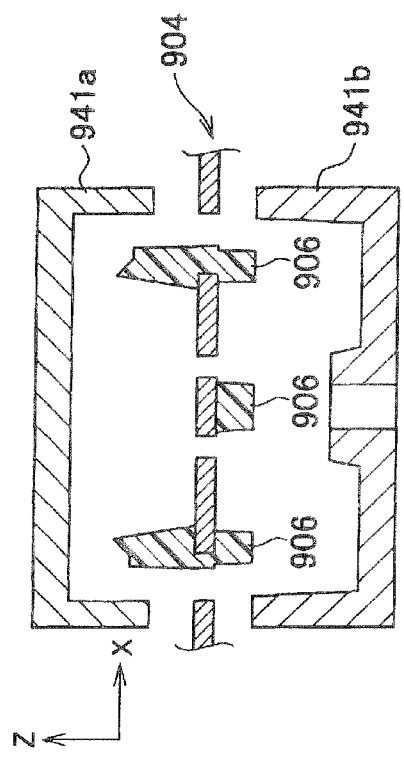
Figure 32B:
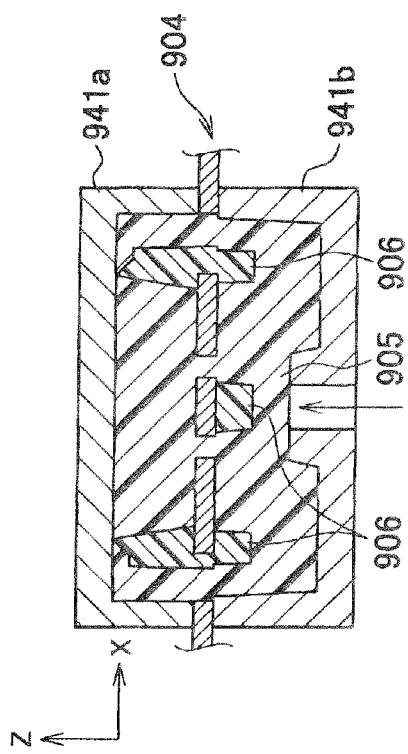
Figure 32C:
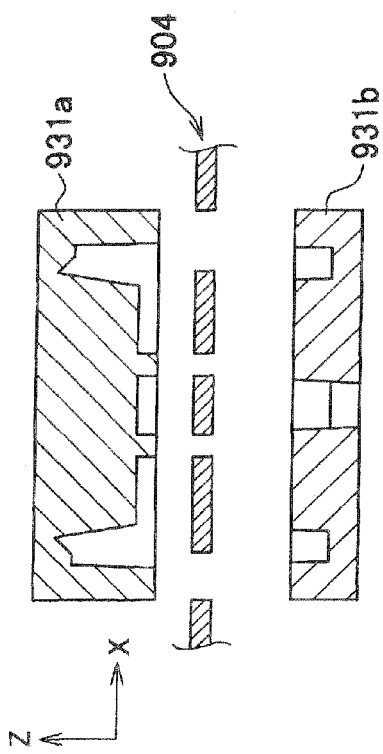
Figure 32D:
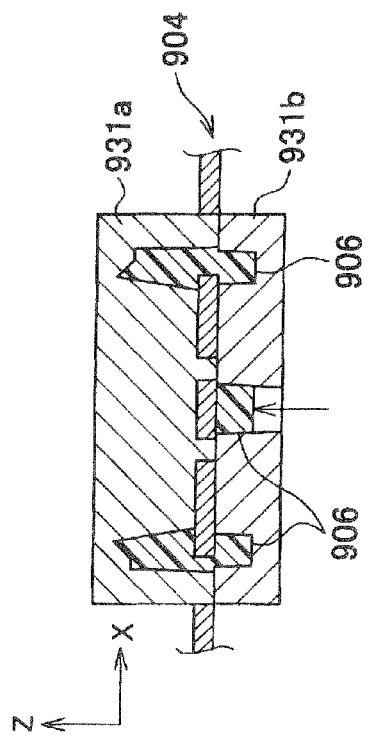

Since the plurality of contacts 10 each bent into a predetermined shape are supported by the first housing 20 (see FIG. 12), and the second housings 30 each covering the first housing 20 are supported by the secondary molding carrier 60 on which the semiconductor device packages 70 can be arranged in high density (see FIGS. 21 and 24) as described above, it is possible to manufacture the semiconductor device package 70 having a large height dimension, and in turn, the light emitting device 120 having a large height dimension, whereby it is possible to reduce an operation error in the manufacturing of the display device 300 (unintended attachment of black-colored resin to the upper surfaces of the light emitting devices 120), and further it is possible to mount the light emitting diodes 100 to the semiconductor device packages 70 arranged in high density. Therefore, it is possible to more efficiently manufacture the light emitting device 120 than the conventional technique (see FIGS. 29 and 31B) in which the conductor portions 904a to 904f are supported by the carrier 915 in a horizontally extending state, and the packages 902 are supported by the carrier 915 in low density.

Further, the dedicated carrier (secondary molding carrier 60) is employed for supporting the semiconductor device packages 70, and hence it is possible to make the thickness dimension of each contact 10 smaller than that of the secondary molding carrier 60. Therefore, it is possible to comply with complication of the shape of each contact, and ensure strength of the secondary molding carrier 60 which has effects on the operation of mounting the light emitting diodes 100 and the secondary molding operation.

Further, since the linking portion 13 of each contact 10 (contact 10 in a bent state) and the first housing 20 are integrated by insert molding, the linking portion 13 of each contact 10 is less liable to be removed from the first housing 20, whereby the location accuracy of the second connection portion 12 is ensured. Therefore, during manufacturing of the display device 300, when the light emitting devices 120 are mounted onto the printed board 200, the light emitting devices 120 are hardly inclined with respect to the mounting surface of the printed board 200, and hence the screen on the display device 300 is less liable to have unevenness. In the present embodiment, since the linking portion 13 of each contact 10 is sandwiched between the first housing 20 and the second housing 30, the linking portion 13 of each contact 10 is further less liable to be removed from the first housing 20.

Although in the above-described embodiment, the thickness dimension of each contact 10 is made smaller than that of the secondary molding carrier 60, each contact 10 may be formed to have the same thickness dimension as the thickness dimension of the secondary molding carrier 60, or may be formed to have a larger thickness dimension than the thickness dimension of the secondary molding carrier 60.

Further, although in the present embodiment, the second housing 30 covers the outer peripheral surface of the first housing 20 and inner wall surface of the first housing 20, the predetermined areas of the first housing 20 to be covered by the second housing 30 are not limited to these.

Although in the present embodiment, the linking portion 13 of each contact 10 is sandwiched between the first housing 20 and the second housing 30, the linking portion 13 is not be necessarily required to be sandwiched between the first housing 20 and the second housing 30.

Further, although in the present embodiment, the first housing 20 is molded of white-colored resin, and the second housing 30 is molded of black-colored resin, the color of first housing 20 is not limited to white, but is only required to be molded of light-colored resin, and the color of the second housing 30 is not limited to black, but is only required to be molded of dark-colored resin.

Note that the semiconductor element is not limited to the light emitting diode 100.

It is further understood by those skilled in the art that the foregoing are the preferred embodiments of the present invention, and that various changes and modification may be made thereto without departing from the spirit and scope thereof.

What is claimed is:

1. A semiconductor device package assembly comprising:
a plurality of semiconductor device packages each including:
a plurality of contacts,
a first housing which is molded of light-colored resin and holds said plurality of contacts, and
a second housing which is molded of dark-colored resin and covers a predetermined area of said first housing; and
a secondary molding carrier which supports said plurality of semiconductor device packages,
wherein each of said contacts includes a first connection portion to which a semiconductor element is connected, a second connection portion which is connected to a substrate, and a linking portion which links said first connection portion and said second connection portion, wherein said first connection portion is exposed in an accommodation cavity formed in an upper portion of said first housing, for accommodating semiconductor elements, wherein said second connection portion is exposed outward from respective lower portions of said first housing and said second housing, wherein said linking portion and at least said first housing are integrated by insert molding, and wherein each of said plurality of contacts is bent into a predetermined shape such that said semiconductor device packages are disposed in said secondary molding carrier in high density.

2. The semiconductor device package assembly as claimed in claim 1, wherein said contacts have a smaller thickness dimension than a thickness dimension of said secondary molding carrier.

3. The semiconductor device package assembly as claimed in claim 1, wherein said linking portion extends in a direction of height of said first housing, and wherein said first connection portion and said second connection portion extend in a direction orthogonal to the direction of the height of said first housing.

4. The semiconductor device package assembly as claimed in claim 2, wherein said linking portion extends in a direction of height of said first housing, and wherein said first connection portion and said second connection portion extend in a direction orthogonal to the direction of the height of said first housing.

5. The semiconductor device package assembly as claimed in claim 1, wherein the predetermined area is an outer peripheral surface of said first housing and an inner wall surface of said first housing.

6. The semiconductor device package assembly as claimed in claim 2, wherein the predetermined area is an outer peripheral surface of said first housing and an inner wall surface of said first housing.

7. The semiconductor device package assembly as claimed in claim 3, wherein the predetermined area is an outer peripheral surface of said first housing and an inner wall surface of said first housing.

8. The semiconductor device package assembly as claimed in claim 4, wherein the predetermined area is an outer peripheral surface of said first housing and an inner wall surface of said first housing.

9. The semiconductor device package assembly as claimed in claim 5, wherein said linking portion is sandwiched between said first housing and said second housing.

10. The semiconductor device package assembly as claimed in claim 6, wherein said linking portion is sandwiched between said first housing and said second housing.

11. The semiconductor device package assembly as claimed in claim 7, wherein said linking portion is sandwiched between said first housing and said second housing.

12. The semiconductor device package assembly as claimed in claim 8, wherein said linking portion is sandwiched between said first housing and said second housing.

13. A semiconductor device assembly wherein each semiconductor element connected to said first connection portion in the semiconductor device package assembly as claimed in claim 1 is sealed in the accommodation cavity by transparent resin filled in the accommodation cavity.

14. The semiconductor device assembly as claimed in claim 13, wherein said contacts have a smaller thickness dimension than a thickness dimension of said secondary molding carrier.

15. The semiconductor device assembly as claimed in claim 13, wherein said linking portion extends in a direction of height of said first housing, and wherein said first connection portion and said second connection portion extend in a direction orthogonal to the direction of the height of said first housing.

16. The semiconductor device assembly as claimed in claim 14, wherein said linking portion extends in a direction of height of said first housing, and wherein said first connection portion and said second connection portion extend in a direction orthogonal to the direction of the height of said first housing.

17. The semiconductor device assembly as claimed in claim 13, wherein the predetermined area is an outer peripheral surface of said first housing and an inner wall surface of said first housing.

18. The semiconductor device assembly as claimed in claim 14, wherein the predetermined area is an outer peripheral surface of said first housing and an inner wall surface of said first housing.

19. The semiconductor device assembly as claimed in claim 15, wherein the predetermined area is an outer peripheral surface of said first housing and an inner wall surface of said first housing.

20. The semiconductor device assembly as claimed in claim 16, wherein the predetermined area is an outer peripheral surface of said first housing and an inner wall surface of said first housing.

21. The semiconductor device assembly as claimed in claim 17, wherein said linking portion is sandwiched between said first housing and said second housing.

22. The semiconductor device assembly as claimed in claim 18, wherein said linking portion is sandwiched between said first housing and said second housing.

23. The semiconductor device assembly as claimed in claim 19, wherein said linking portion is sandwiched between said first housing and said second housing.

24. The semiconductor device assembly as claimed in claim 20, wherein said linking portion is sandwiched between said first housing and said second housing.

25. The semiconductor device assembly as claimed in claim 13, wherein the semiconductor element is a light emitting diode.

26. The semiconductor device assembly as claimed in claim 14, wherein the semiconductor element is a light emitting diode.

27. The semiconductor device assembly as claimed in claim 15, wherein the semiconductor element is a light emitting diode.

28. The semiconductor device assembly as claimed in claim 16, wherein the semiconductor element is a light emitting diode.

29. The semiconductor device assembly as claimed in claim 17, wherein the semiconductor element is a light emitting diode.

30. The semiconductor device assembly as claimed in claim 18, wherein the semiconductor element is a light emitting diode.

31. The semiconductor device assembly as claimed in claim 19, wherein the semiconductor element is a light emitting diode.

32. The semiconductor device assembly as claimed in claim 20, wherein the semiconductor element is a light emitting diode.

33. The semiconductor device assembly as claimed in claim 21, wherein the semiconductor element is a light emitting diode.

34. The semiconductor device assembly as claimed in claim 22, wherein the semiconductor element is a light emitting diode.

35. The semiconductor device assembly as claimed in claim 23, wherein the semiconductor element is a light emitting diode.

36. The semiconductor device assembly as claimed in claim 24, wherein the semiconductor element is a light emitting diode.

* * * * *